United States Patent [19]

Asano et al.

[11] Patent Number: 5,007,788

[45] Date of Patent: Apr. 16, 1991

[54] PITCH CHANGING DEVICE FOR CHANGING PITCHES OF PLATE-LIKE OBJECTS AND METHOD OF CHANGING PITCHES

[75] Inventors: Takanobu Asano, Yokohama; Kenichi Yamaga; Wataru Ohkase, both of Sagamihara, all of Japan

[73] Assignee: Tel Sagami Limited, Kanagawa, Japan

[21] Appl. No.: 342,345

[22] Filed: Apr. 24, 1989

[30] Foreign Application Priority Data

Apr. 25, 1988 [JP] Japan .............................. 63-103403
May 17, 1988 [JP] Japan .............................. 63-119580
Jul. 19, 1988 [JP] Japan .............................. 63-179773

[51] Int. Cl.⁵ ........................................... B65G 65/00
[52] U.S. Cl. ................................. 414/417; 294/87.1; 294/119.1; 414/404; 414/750
[58] Field of Search ............... 414/404, 416, 417, 750; 294/119.1, 87.1, 65

[56] References Cited

U.S. PATENT DOCUMENTS

| | | | |
|---|---|---|---|
| 2,856,089 | 10/1958 | Lennon | 414/417 |
| 2,921,702 | 1/1960 | Gross | 414/417 |
| 3,260,379 | 7/1966 | Bason | 294/65 X |
| 3,302,967 | 2/1967 | Harris et al. | 294/87.1 X |
| 3,542,224 | 11/1970 | Warren | 414/416 |
| 4,120,526 | 10/1978 | Rohner | 294/87.1 |
| 4,466,766 | 8/1984 | Geren et al. | 414/750 X |
| 4,611,966 | 9/1986 | Johnson | 414/417 X |
| 4,832,180 | 5/1989 | Ferrero | 294/87.1 X |

Primary Examiner—David A. Bucci
Attorney, Agent, or Firm—Oblon, Spivak, McClelland, Maier & Neustadt

[57] ABSTRACT

A pitch changing device of the present invention includes a lift mechanism for unloading a plurality of wafers arranged in a cassette at predetermined pitches from the cassette while the pitches are kept unchanged, and a chuck mechanism for holding the unloaded wafers while the pitches are kept unchanged. The chuck mechanism includes moving pieces mounted to be movable in an arrangement direction of the wafers, for respectively supporting the wafers, elastic members mounted in the movable pieces to be expandible/contractible in the arrangement direction of the wafers, and a driving mechanism for expanding/contracting the elastic members. When the elastic members expand/contract by the driving mechanism, the pitches of the wafers are changed while the wafers are held. The lift mechanism includes a handler for variably moving wafer stands in the arrangement direction of the wafers, and changes the pitches while the wafers are lifted.

6 Claims, 21 Drawing Sheets

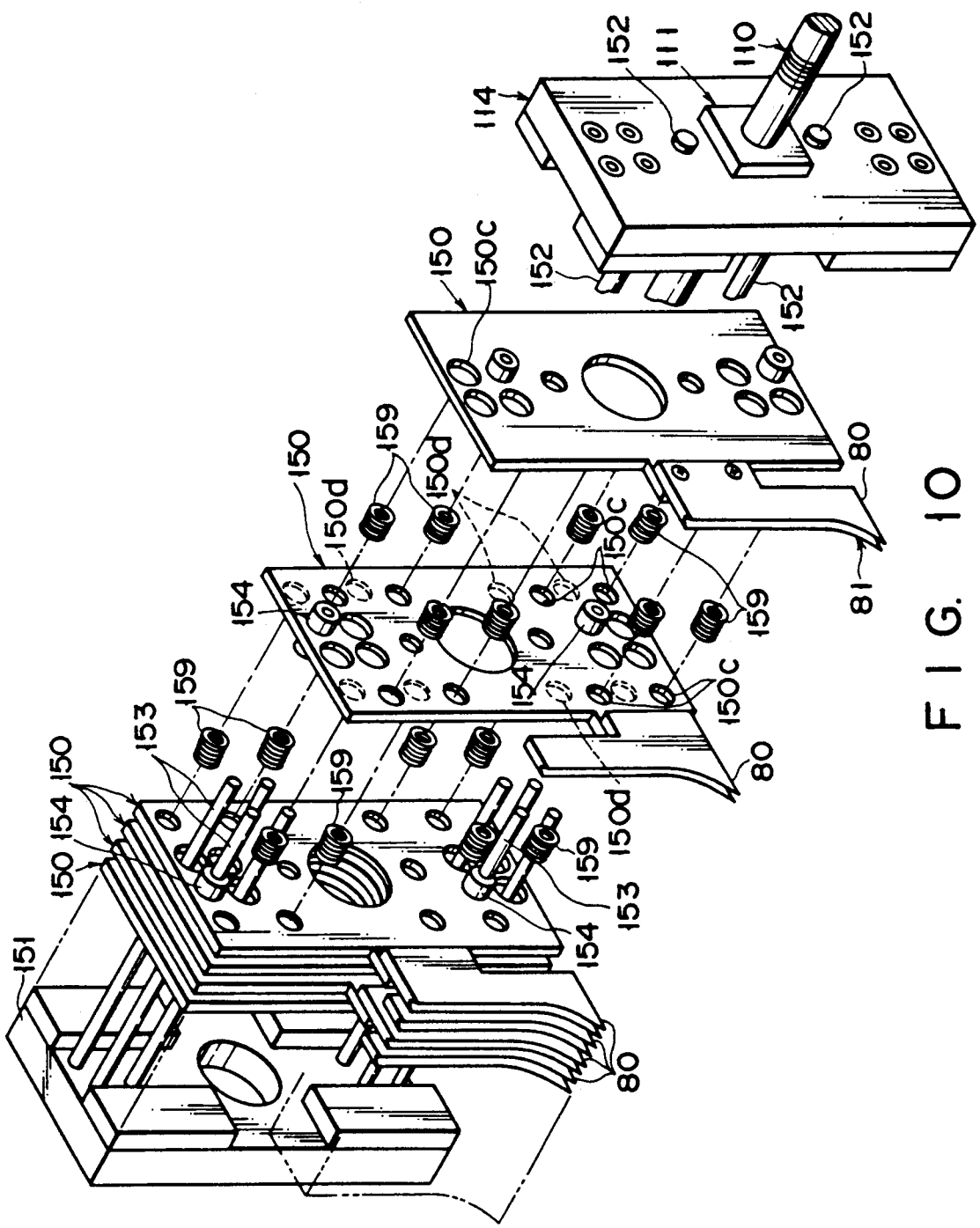
F I G. 10

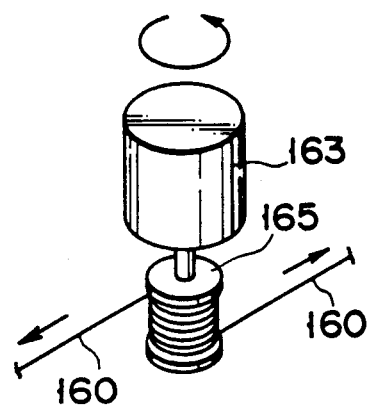
F I G. 16
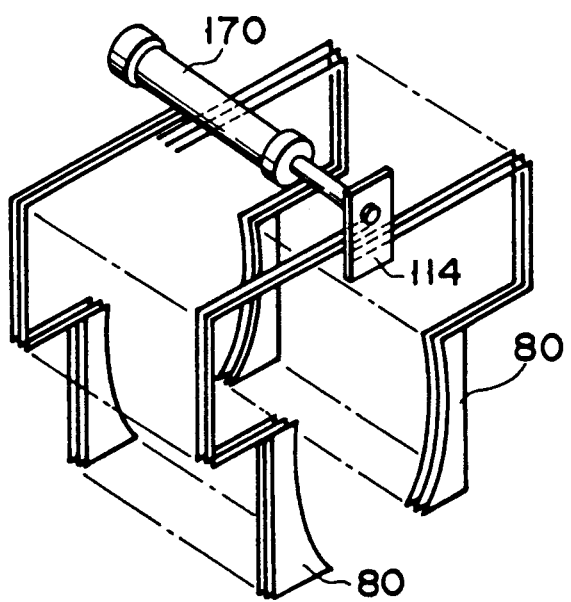
F I G. 17

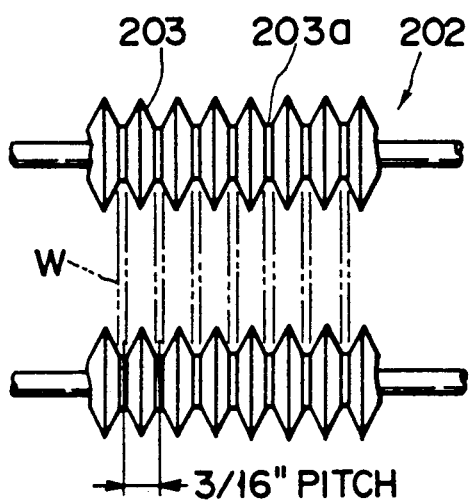
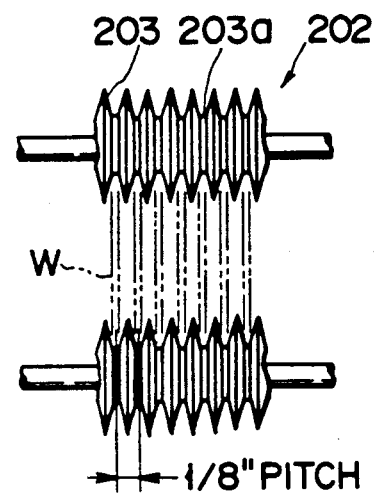
F I G. 20A  F I G. 20B
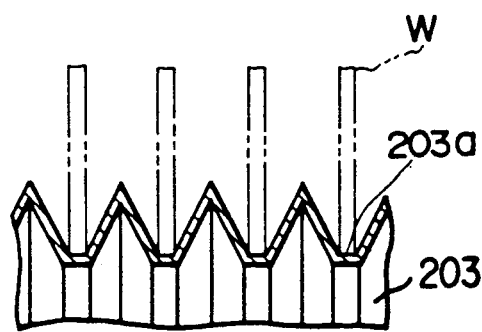
F I G. 21

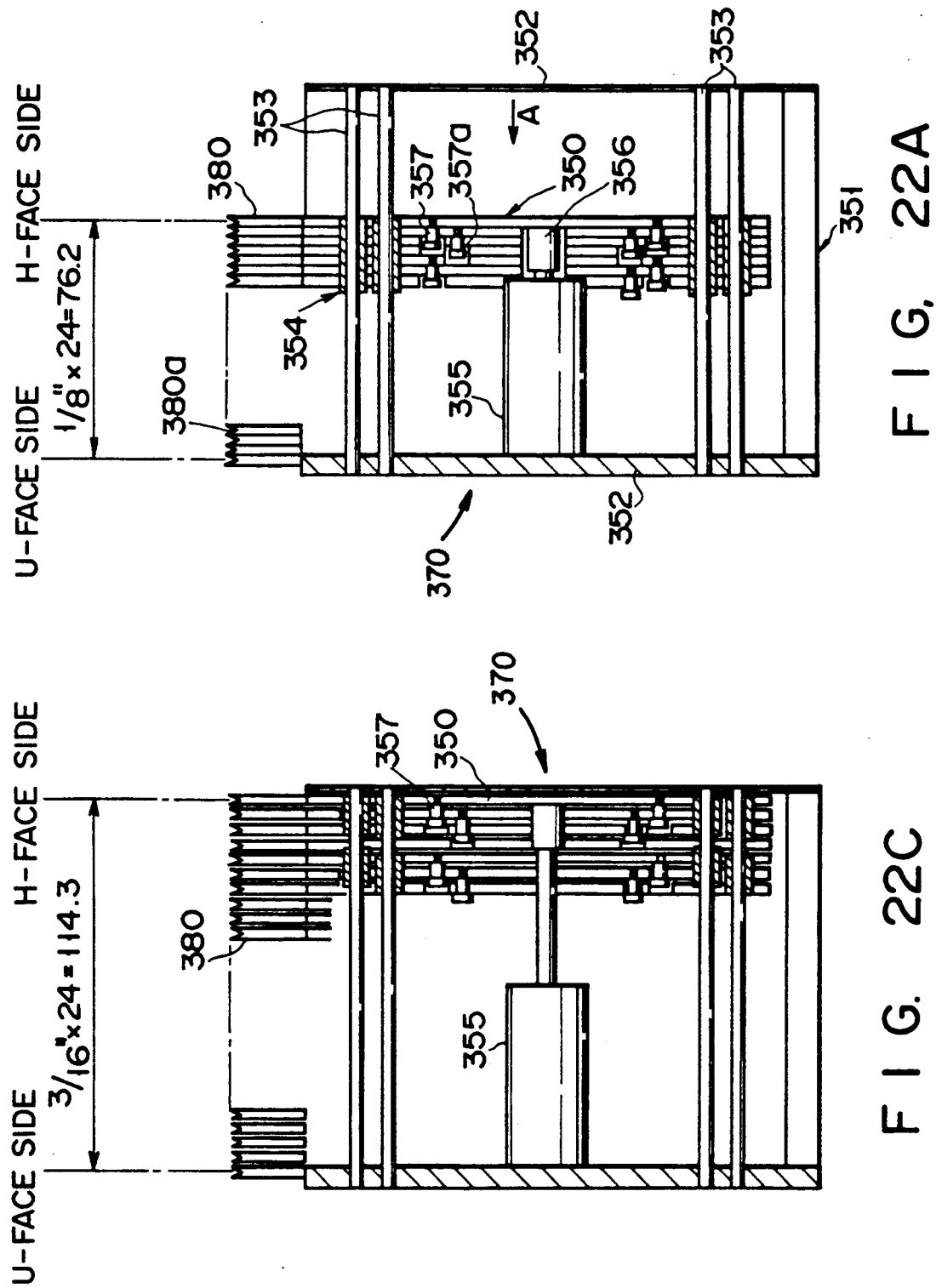

PITCH CHANGING DEVICE FOR CHANGING PITCHES OF PLATE-LIKE OBJECTS AND METHOD OF CHANGING PITCHES

BACKGROUND OF THE INVENTION

1. Field of the Invention

The present invention relates to a pitch changing device for changing intervals between adjacent plate-like objects arranged in a container and a method of changing pitches and, more particularly, to a pitch changing device for changing intervals of a large number of semiconductor wafers when the wafers are transferred between a cassette and a boat, and a method of changing pitches.

2. Description of the Related Art

In a conventional semiconductor element manufacturing device, 25 sheets of semiconductor wafers are loaded on a quartz-boat. Then, the boat is placed in an annealing furnace, and, e.g. 150 sheets of wafers are simultaneously annealed. A transfer device is disposed in front of a port of the annealing furnace. The semiconductor wafers in the cassette are sequentially transferred to the boat by the transfer device.

The transfer device has a pair of clamp members (chuck members) for clamping the wafers. A large number of grooves are formed in a wafer clamp surface of each clamp member at equal intervals (grooves pitch of the cassette or the boat). An edge of each wafer is inserted in the corresponding groove, so that the wafers are held.

The grooves of the clamp members are normally formed at the same pitches as those of the grooves in the inner surface of the cassette, i.e., at pitches of 3/16 inches. In general, a maximum of 25 semiconductor wafers can be contained in one cassette. On the contrary, one boat can generally load a maximum of 200 wafers per lot. In this case, since the annealing conditions are changed for each charge, pitches of the wafers in the boat, i.e., pitches of 3/16 inches are often required to be different from those in the cassette. For example, the wafers are arranged on the boat at pitches of 6/16 inches, 9/16 inches, ⅜ inches, or the like.

Depending on a user, "millimeter" is often designated as a unit of pitch of the wafer arrangement, in place of "inch".

Thus, when the pitches are changed depending on the boat or cassette, since grooves having unchangeable pitches are formed in the clamp members of the conventional transfer device, the pitch change cannot be performed.

According to Japanese Utility Model Disclosure (Kokai) No. 6166944, as shown in FIG. 1, a chuck mechanism 2 wherein intervals between a plurality of chucks 2a are variable is disclosed as clamp members of a transfer device. More specifically, the conventional pitch changing device is constituted by the chuck mechanism 2 including the plurality of chucks 2a for holding a plurality of wafers 1 so that surfaces of the wafers are parallel to each other, a plurality of link members 3 for independently driving chucks 2a to variably change pitches between the adjacent wafers 1, and driving mechanisms 4 for driving these link members 3 at the same time. Fulcrum 3a of the link members 3 are different from each other.

In this device, when the driving mechanisms 4 are rotated, the first ends of the link members 3 are moved by equal distances, and chuck members 2a mounted at the second ends of the link members 3 are moved by different distances depending on their fulcrum positions. As a result, pitches between the adjacent chuck members 2a are changed.

In the above-mentioned conventional device, however, each link member 3 is required for the corresponding chuck member 2a. In addition, since the fulcrums 3a of the link members 3 are different from each other, the device is undesirably complicated, and has a large size.

In addition, in the above-mentioned device, strictly speaking, when the first ends of the link members 3 are moved by equal distances, orbits of the second ends of the link members 3 have an arc-shape. For this reason, although the chuck members 2a coupled to the second ends are guided to linearly slide by a guide, the chuck members 2a tend to be moved along the arcs. Therefore, a moving resistance is large, and smooth movement cannot be realized.

A wafer transfer device including clamp members for allowing a variable change in pitches is disclosed in Japanese Patent Disclosure (Kokai) Nos. 61-244040 and 54-161881. However, since the structures of the devices are complicated and easy handling cannot be achieved. Therefore, both the devices are not practically used.

In the above-mentioned conventional device, when pitches of the wafers are simultaneously changed while each wafer is clamped by the corresponding pair of clamp members, all the pitch changing operations are not completely synchronized. Therefore, an excessive force acts on the wafers, so that the wafers are often damaged.

SUMMARY OF THE INVENTION

It is an object of the present invention to provide a small-sized pitch changing device with a simple structure, which can be easily handled.

It is another object of the present invention to provide a pitch changing device for realizing a small moving resistance of each wafer clamp member upon pitch changing operation, and for smoothly changing the pitches of the wafers.

It is still another object of the present invention to provide a pitch changing device for changing pitches without damaging wafers, and a method of changing pitches.

According to an aspect of the present invention, a pitch changing device for changing pitches between adjacent plate-like objects which are arranged in parallel to each other, comprising: means for unloading a plurality of plate members arranged in a plate-like objects containing means at predetermined pitches from the containing means without changing the pitches; and holding means for holding the unloaded plate-like objects without changing the pitches; the holding means including clamp members on which grooves are formed so that an end of each of the plate-like objects is inserted, at least one pair of elastic members arranged to be expandible/contractible in a direction of an arrangement of the plate-like objects, and driving means for causing the elastic members to expand/contract. When the elastic members expand/contract by the driving means, the intervals between the adjacent plate-like objects are changed together with a change in intervals of the clamp members.

Since the elastic members expand/contract within its elastic margin according to the Hooke's law, a position of each point on the elastic members is determined at one position in proportion to the magnitude of a force acting thereon. In addition, the expanding/contracting operation of the elastic members has repeatability. For this reason, when the wafer clamp members (chuck members) are arranged at equal intervals along a longitudinal direction of the elastic members and the force acts on the elastic members, the intervals between the adjacent chuck members are equally changed according to the Hooke's law.

More specifically, the chuck members are linearly moved together with the elastic members along the longitudinal direction of the elastic members while the equal intervals are always maintained. Even if a pitch changing operation is performed, the intervals between the adjacent chuck members are kept to be equal to each other. As a result, the intervals between the adjacent plate-like objects (semiconductor wafers) clamped by the chuck members are continuously changed.

In addition, when elastic members (e.g., coil springs) are arranged between the chuck members and their free lengths and spring constants are equal to each other, the spring lengths in a case wherein tensile or compression force acts on these springs are equal to each other. For this reason, the distances between the adjacent chuck members can be variably changed while the distances are kept unchanged, thereby executing a pitch change between the adjacent wafers with high reliability.

The wafer clamp members (chuck members) themselves may consist of elastic members. More specifically, elastic bellows mechanisms serve as the clamp members, and the wafers are held by utilizing recesses in the surface of the bellows mechanisms. The intervals between the adjacent recesses of the bellow mechanisms expand/contract in proportion to a force acting thereon. In this case, the bellows mechanism preferably consists of polyfluorocarbon resin or polychlorofluorocarbon resin.

According to another aspect of the present invention, a pitch changing device for changing intervals between adjacent plate members which are arranged in parallel to each other, comprising: handler means for lifting a plurality of plate members arranged at predetermined pitches in the plate member containing means, and holding means for clamping the lifted plate members, the handler means including support member driving means for changing pitches of the support member for supporting the plate members.

According to still another aspect of the present invention, a method of changing pitches to change intervals between adjacent plate members which are arranged in parallel to each other, comprising the steps of: lifting up the plate members by the handler means without changing the pitches of the arranged and contained plate members; moving the plate members at equal intervals together with the support members while the plate members are lifted up and held by the handler means; and changing the pitches of the plate members.

In the above-mentioned device and the method, only lower ends or lower surfaces of the plate members are supported by the support members of the handler means and upper ends of the wafers are free. Therefore, an excessive force does not act on the wafers by the support members upon pitch changing operation. For this reason, when the pitches are changed, the wafers are not damaged, thus safely changing the pitches between the adjacent wafers with high reliability.

However, the present invention is not limited to this. Liquid crystal displays (LCDs) can have their pitches changed.

BRIEF DESCRIPTION OF THE DRAWINGS

FIG. 10 is a perspective view of a mechanism wherein compression coil springs are arranged between adjacent moving pieces, showing another modification of the first embodiment;

FIG. 16 is a perspective view showing a common motor in the mechanism shown in FIG. 15;

FIG. 17 is a perspective view showing elastic members and one air cylinder for expanding/contracting and driving the elastic members in the mechanism shown in FIG. 15;

FIGS. 20A and 20B are front views of the bellows mechanisms disposed in the device of the second embodiment, for explaining an expanding/contracting operation of the bellows mechanisms;

FIG. 21 is a longitudinal sectional view of a part of the bellows mechanism;

FIG. 22A is a cutaway front view of a part of a pitch changing device according to a third embodiment of the present invention;

FIG. 22C is a cutaway front view of a part of the device, for explaining the device of the third embodiment when the pitches of the chuck members are increased;

DETAILED DESCRIPTION OF THE PREFERRED EMBODIMENTS

Various embodiments of the present invention will be described hereinafter with reference to the accompanying drawings.

A lateral four-step furnace (not shown) is installed to perform oxidation and diffusion of silicon wafers. A wafer transfer device is placed in front of the furnace.

Figure 1:
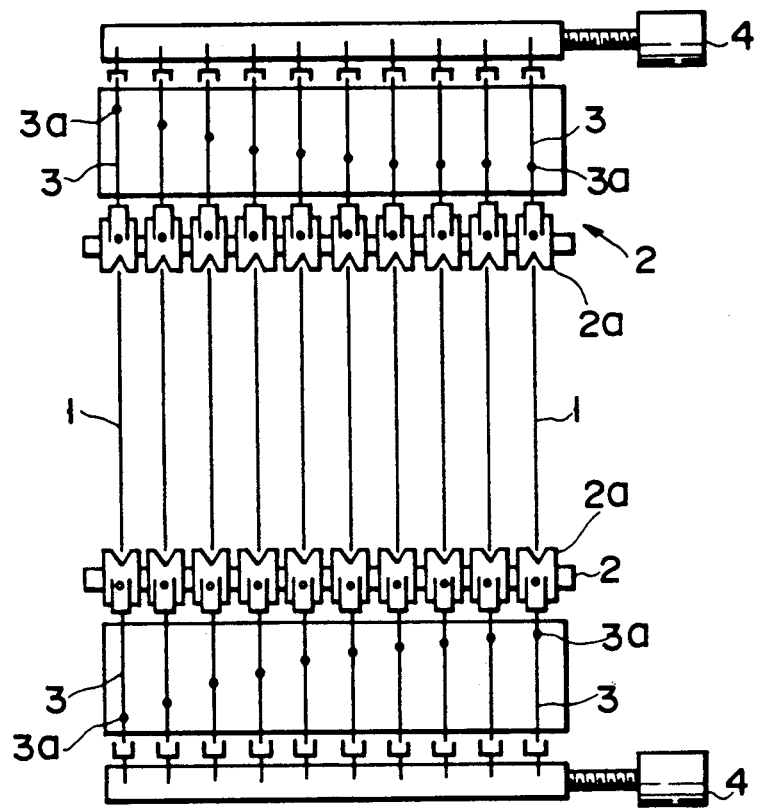
FIG. 1 is a schematic view showing a conventional pitch changing device.
Figure 2:
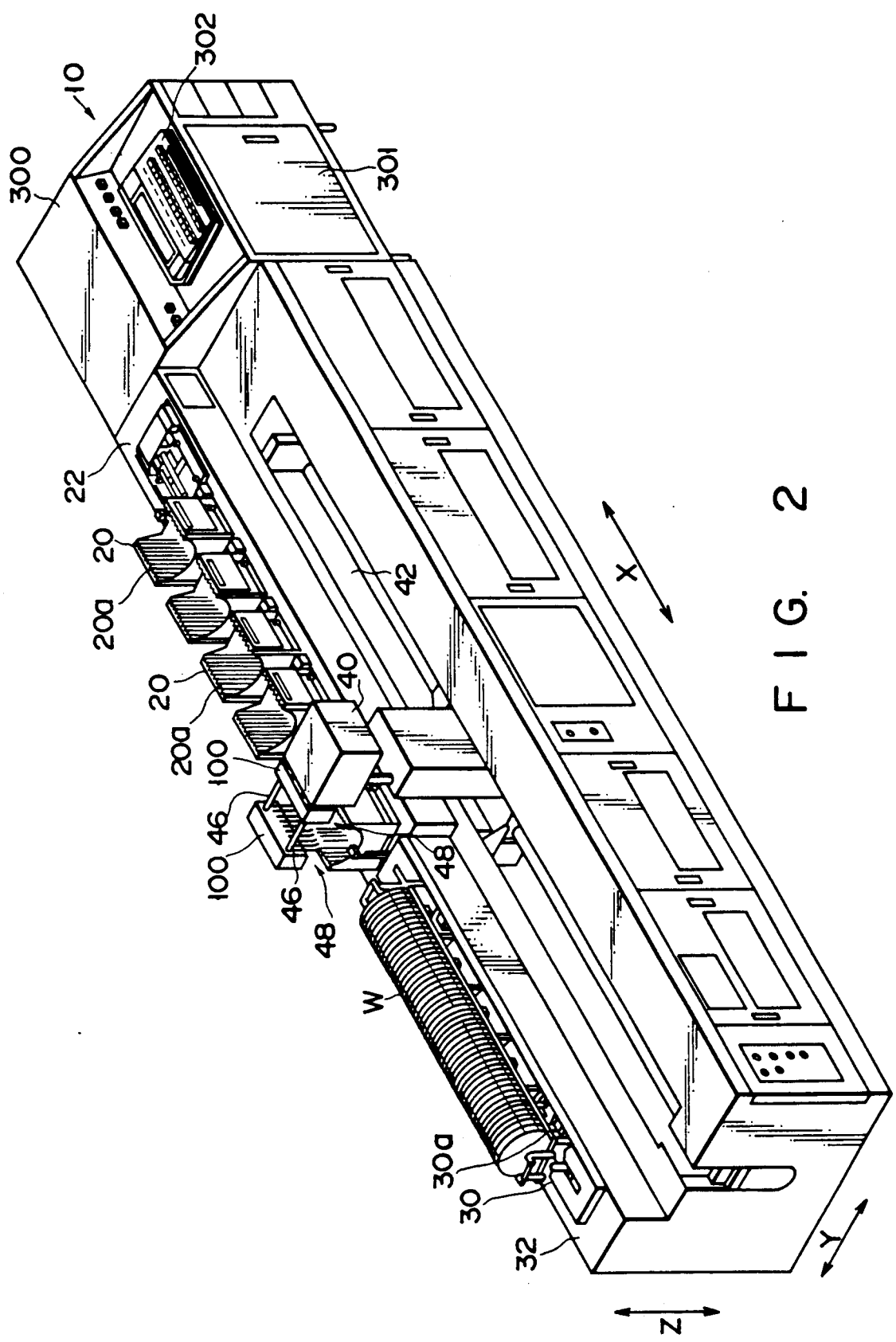
FIG. 2 is a perspective view of an entire wafer transfer device.

As shown in FIG. 2, a wafer transfer device 10 includes a cassette stage 22 on which a plurality of wafer cassettes 20 are placed, and a boat stage 32 on which a boat 30 is placed. These stages 22 and 32 are positioned on the single line and in the same elevation, and are arranged in series so that the longitudinal direction is parallel to the X-axis. The cassettes 20 and the boat 30 are respectively placed on the stages 22 and 32 so that pattern formation surfaces of wafers W are parallel to the Y-axis. Note that large numbers of grooves 20a and 30a are respectively formed in the portions for loading the wafers W of the cassettes 20 and the boat 30 at pitches of 3/16 inches, so as to match with edge curves of the wafers W.

A chuck device 40 is disposed in a moving groove 42 formed along the stages 22 and 32. An internal portion of a main body 300 of the transfer device is substantially hollow. An X-axis moving mechanism (not shown) is arranged in the space to cause the chuck device 40 to slide along the X-axial direction. Note that the wafer transfer device 10 includes a panel 301 backed up by a computer system, and has such an arrangement that necessary data can be input by a keyboard 302 connected to the panel 301.

Figure 3:
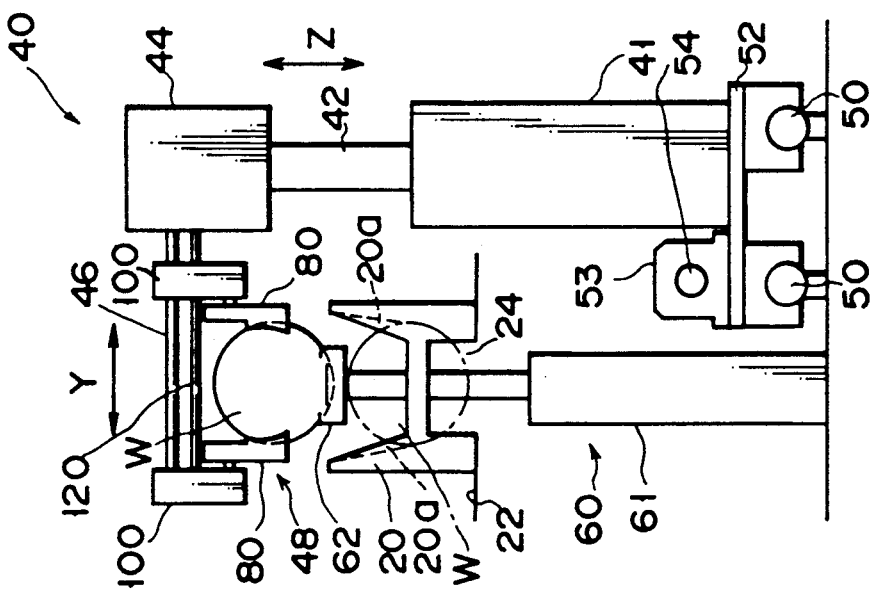
FIG. 3 is a view of the wafer transfer system when viewed from its side portion, showing a positional relationship between a wafer clamp mechanism and a wafer lifting mechanism upon operation.

As shown in FIG. 3, a pair of guide rails 50 parallel to each other and a ball screw 54 extend along the X-axis in the space of the main body 300. A slider 52 is mounted to straddle the pair of guide rails 50. A vertically moving cylinder 41 and a nut 53 are mounted on the slider 52. The nut 53 and the ball screw 54 are threadably engaged with each other, and one end of the ball screw 54 is coupled to a driving shaft of a pulse motor (not shown). The pulse motor is connected to a controller backed up by the computer system.

An upper end of a rod 42 of the vertically moving cylinder 41 is connected to a head 44. The head 44 incorporates a plurality of motors and a plurality of reduction gears. A gear mechanism is controlled by the computer so that gear shafts are interlocked and reciprocated along the Y direction. Distal ends of the two pairs of gear shafts are respectively connected to arms 46. In addition, a pitch change driving unit 100 is mounted at each distal end of the pairs of arms 46. More specifically, when the gears in the head 44 are driven, one pair of pitch change driving units 100 approach to or move away from each other.

Figure 4:
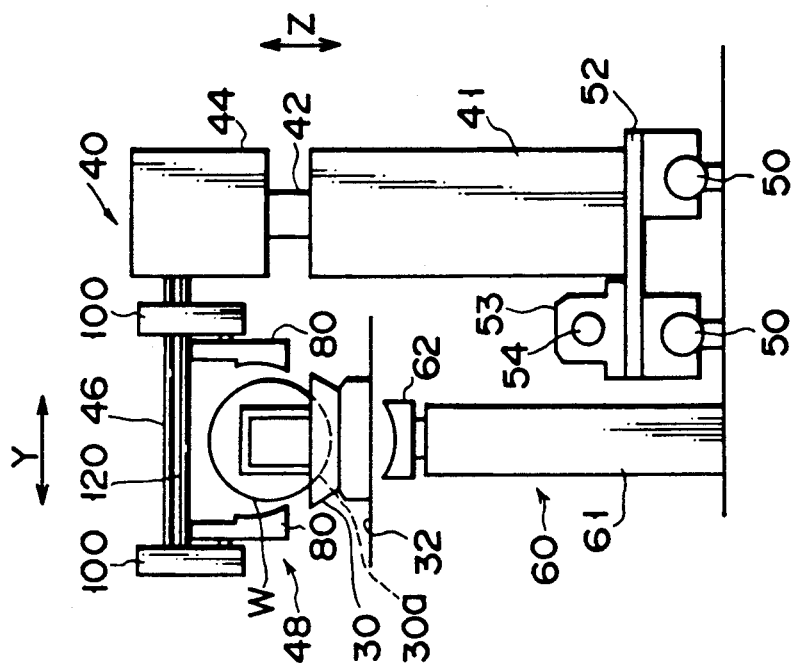
FIG. 4 is a view of the wafer transfer device when viewed from its side, showing a positional relationship between the wafer clamp mechanism and a boat.

Lift mechanisms 60 for lifting the wafers will be described hereinafter with reference to FIGS. 3 and 4.

A plurality of lift mechanisms 60 are disposed below the cassette stage 22. Each lift mechanism 60 is positioned immediately under the corresponding cassette 20 placed on the stage 22. The lower portion of each cassette 20 is open, and this lower opening and an insertion port 24 of the stage 22 communicate with each other. A table member 62 is mounted at an upper end of a rod of a vertically moving cylinder 61 of each lift mechanism 60. Grooves are formed in an upper surface of the table member 62 at the same pitches as those of the grooves 20a formed in the inner surface of each cassette 20.

Figure 5A:
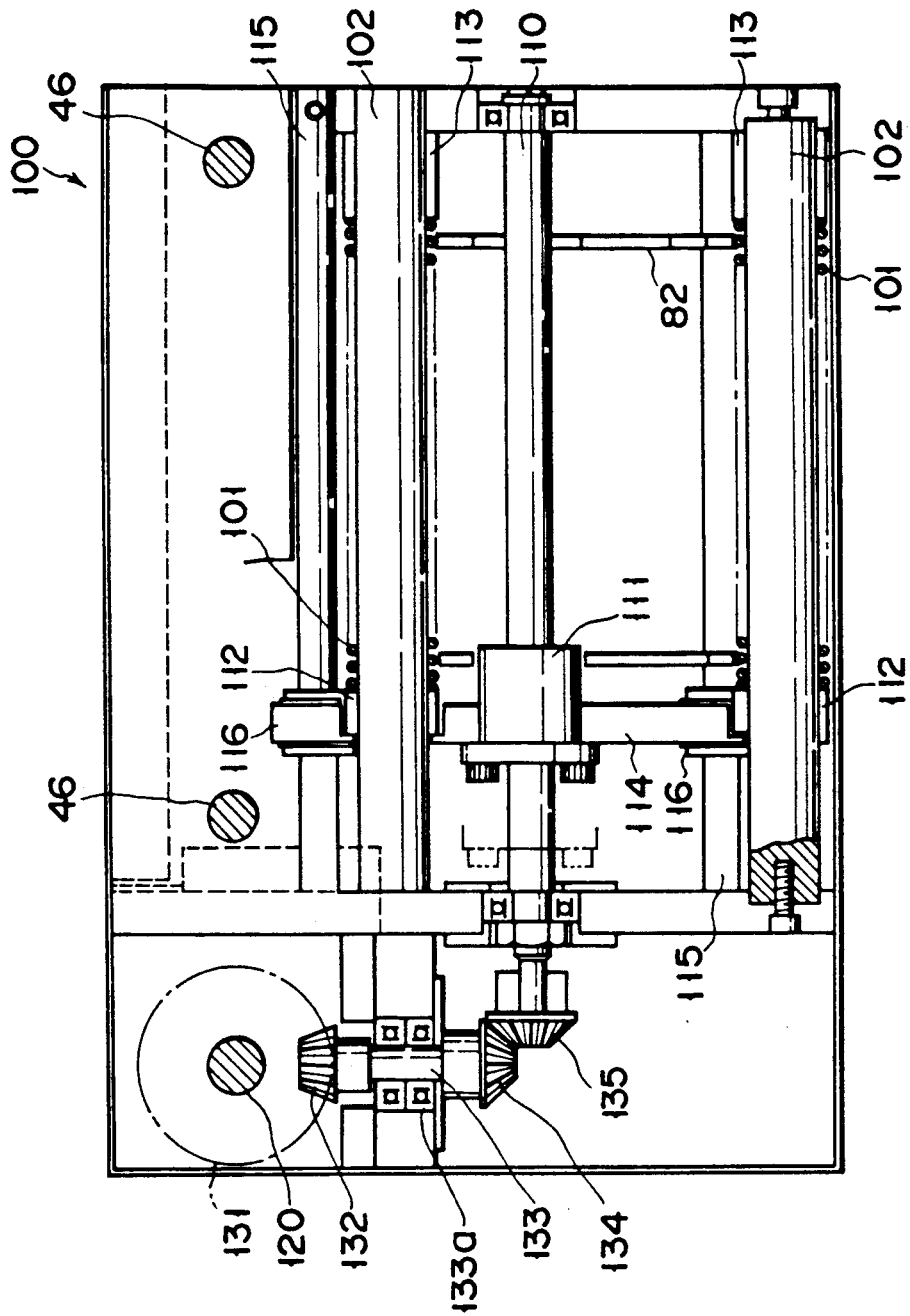
FIG. 5A is a cutaway front view showing a main part of a pitch changing device according to a first embodiment of the present invention.
Figure 5B:
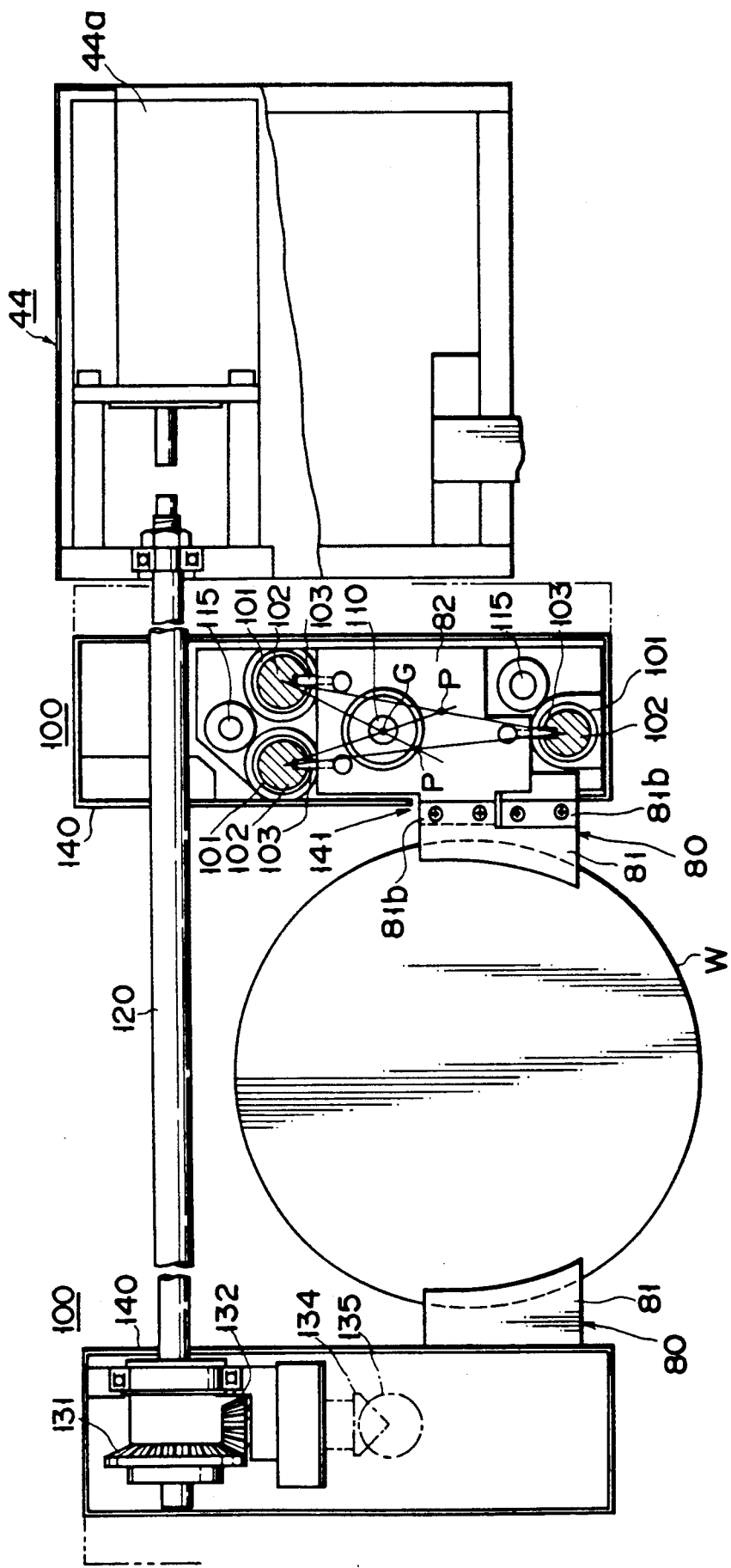
FIG. 5B is a cutaway side view showing the main part of the pitch changing device according to the first embodiment of the present invention
Figure 5C:
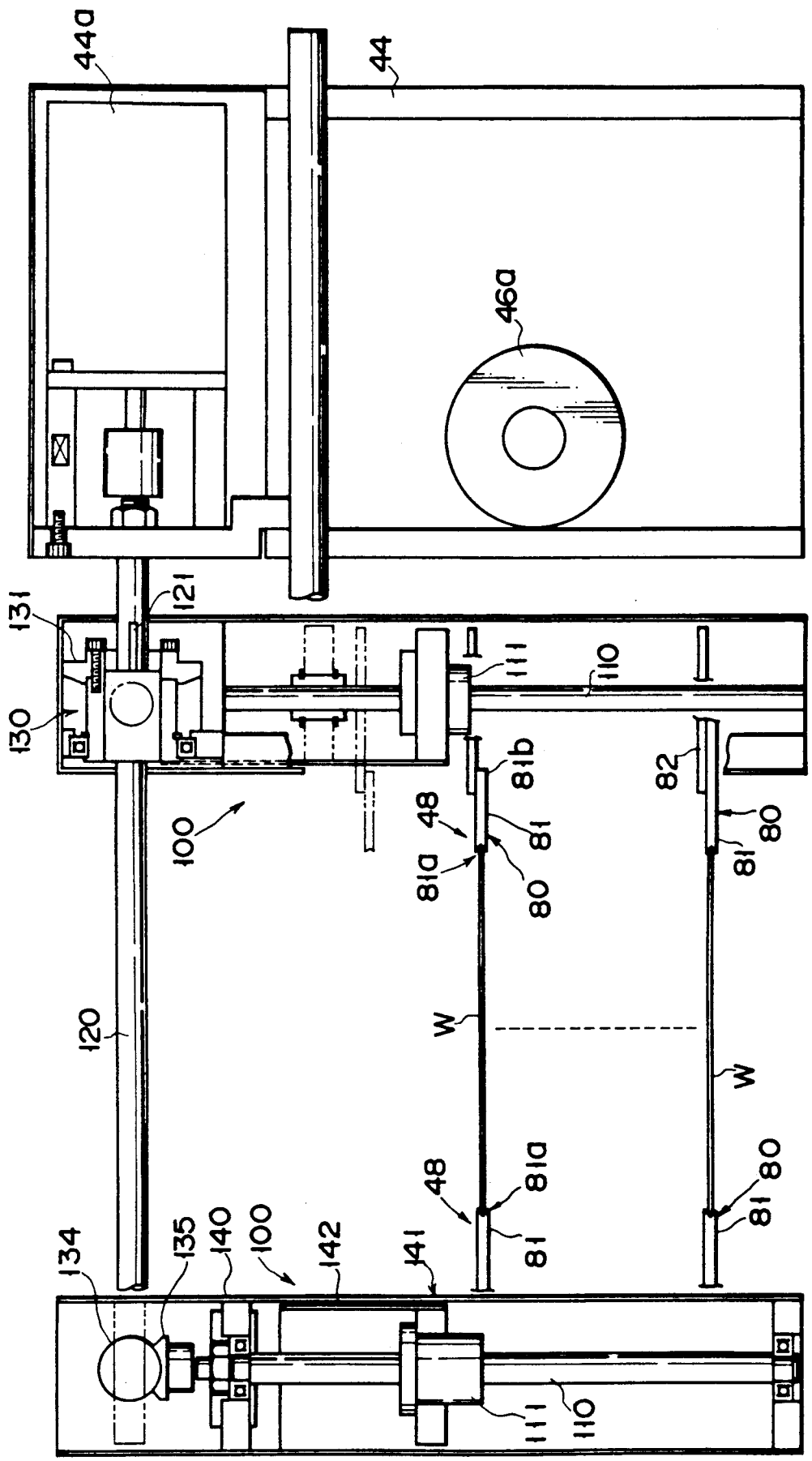
FIG. 5C is a cutaway plan view showing the main part of the pitch changing device according to the first embodiment of the present invention.

As shown in FIG. 5C, a pair of chucks 48 in the chuck mechanism 40 are separated into chuck portions 80 for clamping one wafer W. The chuck portions 80 are respectively mounted at the pitch change driving units 100, and adjacent intervals (pitches) between the adjacent chuck portions 80 are changed by the pitch change driving units 100.

A groove 81a is formed at a distal end of the chuck piece 81 of each chuck portion 80 so that each edge of the corresponding wafer W is fitted therein. Each chuck piece 81 consists of, e.g., TEFLON or DIFLON (Du Point's (trade mark)). The 25 pairs of chuck pieces 81 are respectively supported by moving pieces 82. Note that each chuck piece 81 is fixed to one side surface of the corresponding moving piece 82 by a flat head screw or the like.

As shown in FIG. 5B, in order to decrease the minimum pitches between the adjacent chuck pieces 81, in portions for coupling the chuck pieces 81 to the moving pieces 82, the chuck piece 81 having an upper coupling portion 81b and the chuck piece 81 having a lower coupling portion 81b are alternately arranged.

In the arms 46 for opening/closing the chuck, racks are formed on opposing surfaces of the two adjacent arms 46, and pinion gears (not shown) are mounted to mesh with both the rack. These pinion gears are coupled to the driving shafts of the motors 46a incorporated in the head 44, respectively. When the pinion gears are rotated and driven, the distances between the pitch change driving units 100 are changed.

As shown in FIG. 5A, each pitch change driving unit 100 includes compression springs 101 of stainless steel as elastic members, guide shafts 102, and a ball screw 110 coupled to the guide shafts 102.

In the first embodiment, as shown in FIG. 5B, the springs 101 are respectively mounted on the three guide shafts 102. More specifically, the springs 101 are respectively mounted on the two upper guide shafts 102 and one lower guide shaft 102. Note that an outer diameter of each guide shaft 102 is determined in accordance with an inner diameter of the corresponding compression spring 101 when it extends to its maximum length.

The relative positional relationship among the three guide shafts 102 will be described below with reference to FIG. 5B. The three guide shafts 102 are arranged so that the ball screw 110 to be described later is positioned at the center of gravity G of the three guide shafts 102. The center of gravity G of the three guide shafts 102 is obtained as follows.

First, bisection points P of lines for connecting centers of the two upper guide shafts 102 to the center of the lower guide shaft 102 are obtained. An intersection point of lines for connecting these points P and the centers of the two upper guide shafts 102 serves as the center of gravity G.

Figure 6:
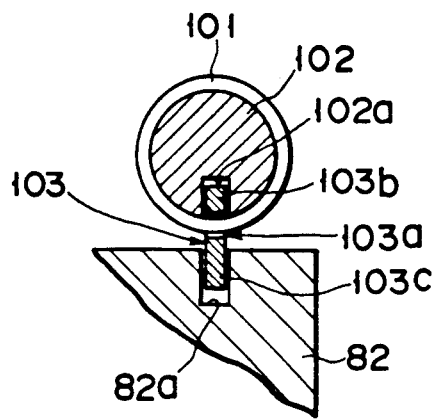
FIG. 6 is a cross-sectional view for explaining a coupling state of a moving piece to a coil spring.

As shown in FIG. 6, a support pin 103 is fitted on each turn of the spring 101. Each turn of the spring 101 is coupled to the corresponding moving piece 82 by the supporting pin 103. A hole 103a is formed in an intermediate portion of each support pin 103 to fit on the spring 101. One end 103b of each support pin 103 is fitted in a corresponding groove 102a of the guide shaft 102. On the other hand, the other end 103c of each support pin 103 is fitted in a hole 82a formed in an end face of the corresponding moving piece 82.

Figures 7A, 7B, 7C:
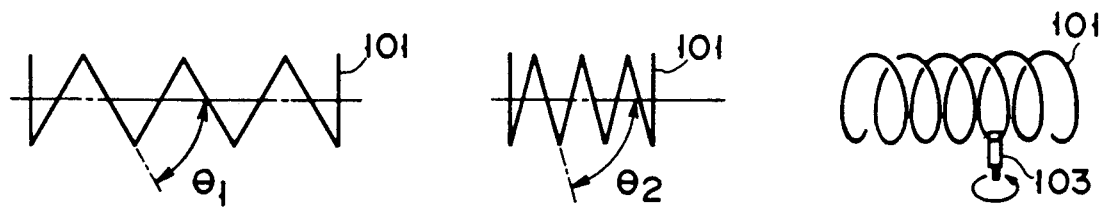
FIGS. 7A, 7B, and 7C are views typically showing the coil springs, for explaining a reason why the compression coil spring is coupled to a supporting pin with a margin.

The reason why each moving piece 82 is coupled to the corresponding spring 101 with a margin will be described below with reference to FIGS. 7A to 7C.

The first reason is that the rotation of the moving pieces 82 is prevented. More specifically, a gradient $\theta_1$ of a coil line with respect to the center line when the compression spring 101 extends is different from a gradient $\theta_2$ of a coil line with respect to the center line when the compression spring 101 contracts. Therefore, as shown in FIG. 7C, although each support pin 103 is slightly rotated about an axis, the corresponding moving piece 82 is not rotated together with the support pin 103 because the support pin 103 is fitted in the moving piece 82 with a margin.

The second reason is convenience of assembly. When each support pin 103 is fixed to the corresponding moving piece 82 by caulking or welding, it is extremely difficult that the support pins are accurately arranged on a single generating line and that the distances between ends of the springs and the support pins 103 are equalized. Therefore, a coupling structure with a margin is employed, and easy assembly is realized. In addition, the support pins 103 fitted on the springs 101 by the grooves 102a of the guide shafts 102 can be held on the single generating lines, respectively.

A mechanism for changing pitches between the adjacent chuck pieces 81 using the springs 101 will be described below with reference to FIG. 5A.

The ball screw 110 serving as a driving shaft is threadably engaged with a nut 111. The nut 111 is fixed to a moving plate 114. A pair of movable bearings 116 are respectively mounted at upper and lower ends of the moving plate 114 along a slide guide shaft 115. The moving plate 114 has bushes 112 to be respectively fitted on the guide shafts 102. Each bush 112 abuts against an end face of the corresponding spring 101.

Note that the other end face of each spring 101 abuts against the corresponding stopper 113. Therefore, when the above-mentioned ball screw 110 is rotated to move the nut 111, each spring 101 extends/contracts by the corresponding bush 112.

A mechanism for transmitting a driving force to the ball screw 110 will be described below with reference to FIG. 5C.

A rotating shaft 120 is coupled to the driving shaft of the motor 44a. The length of the rotating shaft 120 is enough to compensate for a maximum spacing distance between the pair of pitch change driving units 100. A spline 121 extends from the rotating shaft 120. The length of the spline 121 corresponds to a moving stroke of the pitch change driving unit 100.

On the other hand, a rotational direction change unit 130 is disposed in each pitch change driving unit 100. The rotational direction change unit 130 is fitted on the spline 121 to be rotatable together with the shaft 120 and to be slidable. The rotational direction change unit 130 has a first bevel gear 131.

As shown in FIG. 5A, the first bevel gear 131 is meshed with a second bevel gear 132. The second bevel gear 132 is fixed to one end of a vertical shaft 133 supported by a bearing 133a. A third bevel gear 134 is fixed to the other end of the vertical shaft 133. The third bevel gear 134 is meshed with a fourth bevel gear 135 fixed to one end of the ball screw 110.

In this embodiment, each pitch change driving unit 100 having the above-mentioned driving section is covered with a corresponding cover 140 to prevent attachment of a foreign substance such as dust to the wafers W. In this case, the air in the cover 140 is preferably discharged. Note that an opening 141 is formed in each cover 140, and the coupling portion 81b of the chuck piece 81 is movable along the axial direction of the ball screw 110. Note that a door 142 is mounted to each nut 111 to partially cover the corresponding opening 141, thus minimizing a opening width of the cover 140.

A case wherein the pitches of the wafers W are changed from 3/16 inches to ⅛ inches using the above mentioned device will be described hereinafter.

The chuck device 40 is positioned in front of a given cassette 20. The wafers W in the cassette 20 are simultaneously lifted by the lift mechanism 60. One pair of arms 46 extend from the head 44, and the other pair of arms 46 moves backward to clamp each wafer W by the corresponding chuck portions 80 of the chucks 48. At this time, each interval between the adjacent chuck portions 80 is 3/16 inches. Then, the rotating shaft 120 is rotated by the predetermined number of revolutions by the motor 44a. Therefore, rotational forces are transmitted from the shafts 120 to the vertical shafts 133 through the first and second bevel gears 131 and 132. Therefore, the ball screws 110 are rotated and the nuts 111 move along the axial direction. As a result, end faces of the springs 101 are urged by the bushes 112 which move along the guide shafts 102 together with the nuts 111, respectively.

The springs 101 are compressed, points of the springs 101 are displaced by the equal distances according to the Hooke's low. For this reason, the turn pitches of the springs 101 are variably changed while the turns are kept at equal pitches. When the support pin 103 is fitted on each turn, the turn pitch is variably changed while the support pins 103 are kept at equal pitches.

In particular, in the first embodiment, since the springs 101 which are arranged in three positions are moved by the ball screw 110 positioned at the center of gravity G, the urging force is dispersed to keep well balance. Therefore, the pitch change in the wafers W can be effectively performed without failure.

Assume that the device in the above embodiment is used as a manufacturing device of a semiconductor element, when dust or the like produced from the movable members is attached to the wafers W, a product yield of the wafers W is decreased. Therefore, the movable members are covered with the covers 140 to prevent scattering of dust from the movable members with high reliability.

In addition, in the first embodiment, air exhaustion is performed in the covers 140, and dust produced from the movable members is discharged, so that the clean room can be kept in a clean state. In this case, the doors 142 cover excessive openings so that the opening 141 of each cover 140 has a minimum opening width in accordance with the pitches between the chuck portions 80. Therefore, attachment of dust to the wafers W can be further suppressed.

Figure 8:
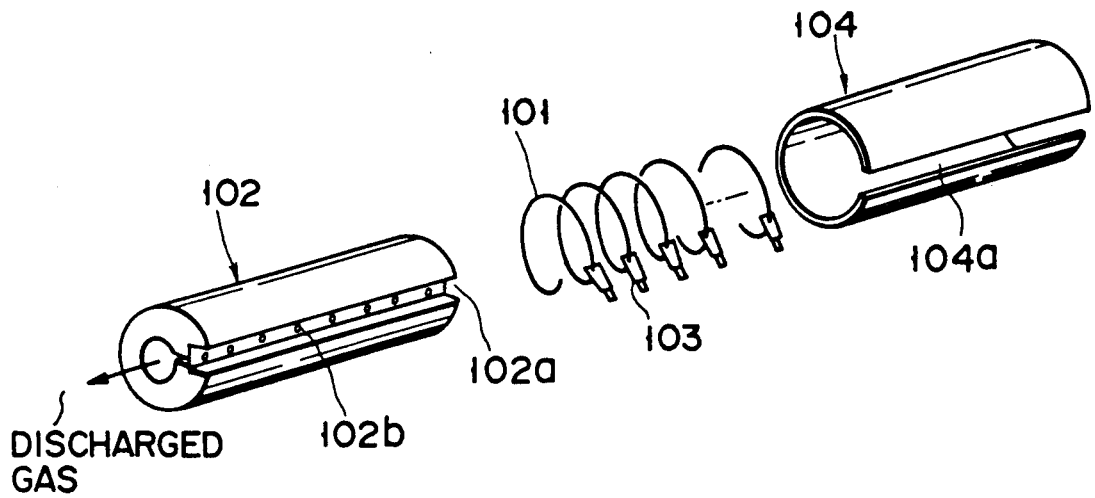
FIG. 8 is a perspective view of a dust-free guide shaft in which the coil spring and the supporting pin are contained, showing a modification of the first embodiment.
Figure 9:
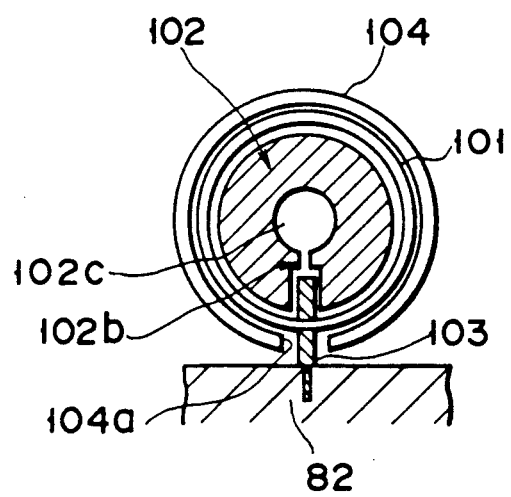
FIG. 9 is a side sectional view showing the guide shaft in the modification of the first embodiment.

It is considered that dust sources are the compression springs 101 and the sliding portions of the guide shafts 102 and the support pins 103. In order to effectively discharge the dust produced in these sliding portions, the guide shafts 102 may be modified, as shown in FIGS. 8 and 9.

In this modification, a cylindrical cover 104 is mounted on each compression spring 101, and a slit 104a is formed along a moving path of the support pins 103. A space 102c is formed in each guide shaft 102 to communicate along the axial direction. A plurality of suction holes 102b are formed in a groove 102a of each guide shaft 102 to communicate with the space 102c. Each suction hole 102b communicates with an air-pump (not shown).

In the above-described modification, the exhaustion in each space 102c is performed, so that the dust produced by the sliding portions can be effectively discharged.

Note that the guide shafts 102 and the springs 101 can be made of a material of a reinforced aluminum alloy coated with Teflon (Trade Mark).

Although the compression springs 101 are used as elastic members in the above-mentioned first embodiment, the present invention is not limited thereto, and extension springs each having a hook at coil ends may be used as elastic members. In this case, each section of the springs is not limited to a circle but may be a square.

A modification of the first embodiment will be described hereinafter with reference to FIGS. 10 to 14.

Figure 11B:
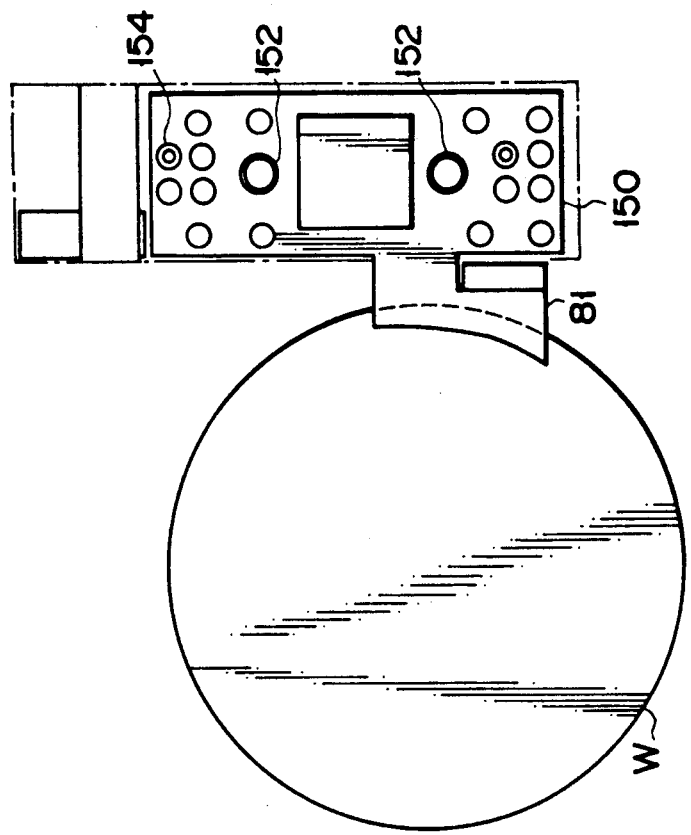
FIG. 11B is a cross-sectional view of the mechanism shown in FIG. 10.
Figure 11A:
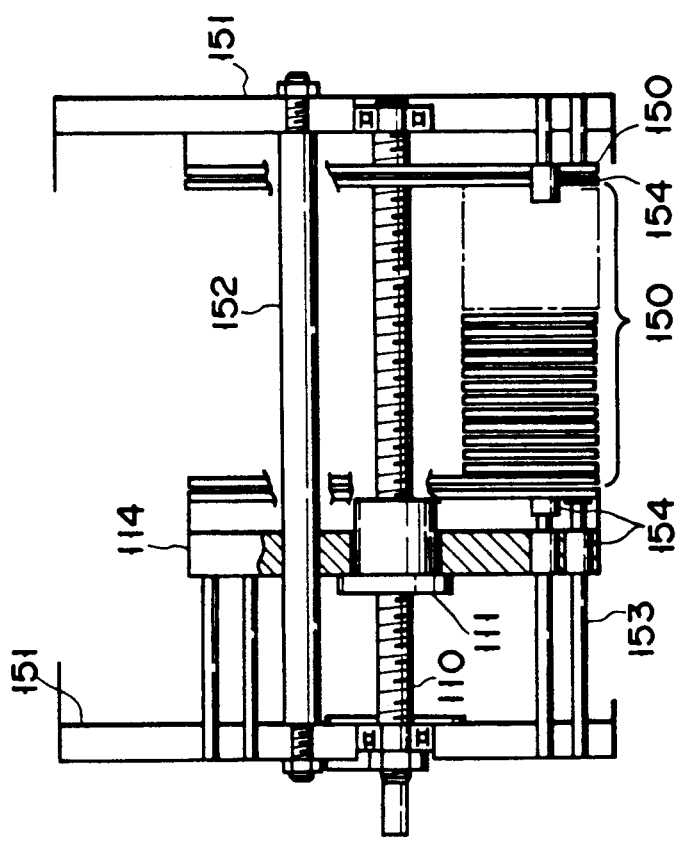
FIG. 11A is a longitudinal sectional view of the mechanism shown in FIG. 10.

FIG. 10 shows a substantially half of the pitch changing device. As shown in FIG. 10, eight compression springs 159 are arranged between adjacent moving pieces 150. As shown in FIG. 11A, a moving plate 114 is reciprocally movable along the ball screws 110 between a pair of side plates 151. In addition, 25 moving pieces 150 are arranged between the moving plate 114 and one side plate 151 at equal intervals. The pair of side plates 151 are coupled to each other through two stays 152, and four upper guide rails 153 and four lower guide rails 153, i.e., eight guide rails 153 are mounted between the pair of side plates 151.

Figure 12A:
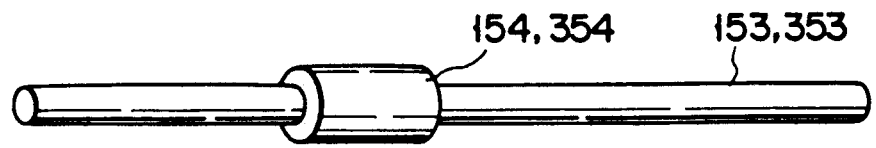
FIGS. 12A and 12B are perspective views showing guide rails and slide ball bearings in the mechanism shown in FIG. 10.
Figure 12B:
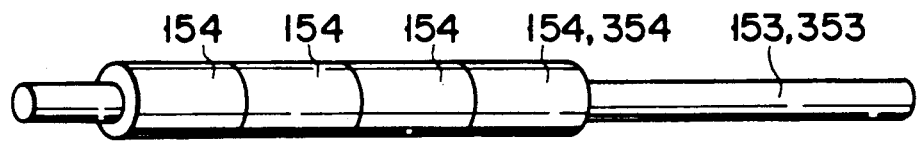

An upper slide ball bearing 154 and a lower slide ball bearing 154 are mounted at each moving piece 150, and the moving pieces 150 slide through the upper guide rail 153 and the lower guide rail 153. In this case, the length of each bearing 154 is 12 mm, i.e., is smaller than the thickness of each moving piece 150 by 3 mm. Therefore, when the moving pieces 150 having the bearings 154 are supported by the single guide rail 153, the length of each bearing 154 must be a minimum pitch, as shown in FIG. 12B. As a result, general minimum pitches of the wafers W cannot be realized.

Figure 12C:
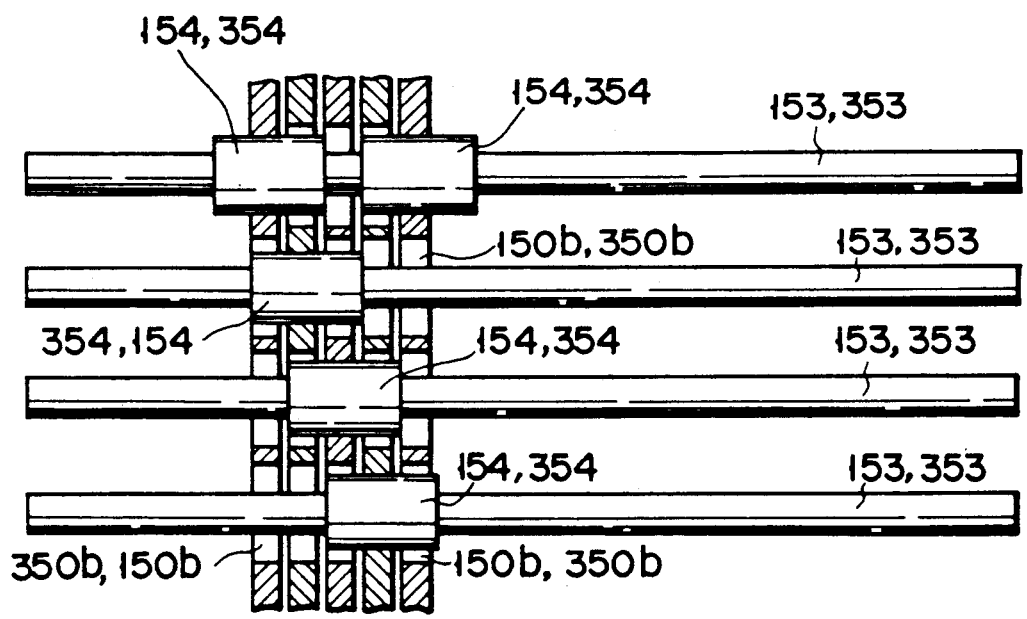
FIG. 12C is a front view of the guide rails and the slide ball bearings by removing the moving piece in the mechanism shown in FIG. 10.

As shown in FIG. 12C, four upper guide rails 153 and four lower guide rails 153 are used, and a different guide rail 153 is used for each moving piece 150.

For this reason, as shown in FIG. 12C, besides an upper hole 150a and a lower hole 150a for fixing the slide ball bearings 154 between the adjacent moving pieces 150, three upper holes 150b and three lower holes 150b for preventing interference of the bearings are formed.

Figure 13:
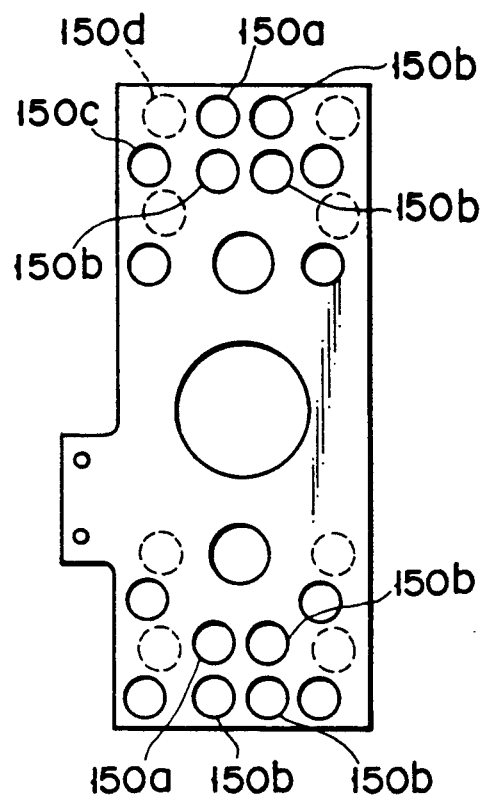
FIG. 13 is a plan view showing the moving piece in the mechanism shown in FIG. 10.

As shown in FIG. 13, four upper spot-faced holes 150c and four lower spot-faced holes 150c for supporting the springs are formed in one surface of each moving piece 150. In the other surface, the same number of spot-faced holes as that of the holes 150d are formed at positions different from those of the holes 150c. The springs 159 supported by these spot-faced holes 150c and 150d consist of, e.g., stainless steel (SUS 304).

Figure 14:
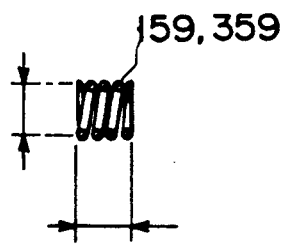
FIG. 14 is a longitudinal sectional view showing the compression coil spring in the mechanism shown in FIG. 10.

As shown in FIG. 14, the effective number of turns of each compression spring 159 is three, its total number of turns is five, a diameter of the wire is 1 mm, an average coil diameter is 7 mm, a free length is 7 mm, and a spring constant is 0.9 kg/mm. In this case, the load of each spring 159 when it is mounted is 0.9 kg, and the compression length thereof is 6 mm. When the load of each spring is a maximum load, i.e., 2.7 kg, its compression length is 4 mm. If the depth of each of the spot-faced holes 150c and 150d, formed in the moving piece 150 having a thickness of 3 mm, is 2 mm or more, the springs 159 each having a length of 4 mm upon the maximum load can be completely fitted in the holes 150c and 150d. Therefore, the minimum pitches can be realized when the moving pieces 150 are adhered to each other.

As shown in FIG. 11A, when the moving plate 114 is moved rightward by rotating and driving the ball screw 110, the compression springs 159 between the adjacent moving pieces 150 receive equal forces, and are compressed by equal amounts. Therefore, the pitches are changed while the moving pieces 150 are kept at equal pitches.

In addition, in the above-mentioned modification, the common motor 44a is arranged in the head 44 as a driving system for executing pitch change in wafers W, and a system wherein the rotation of the motor 44a is transmitted to the ball screw 110 disposed at the center of gravity G of the three moving members is employed.

Figure 15:
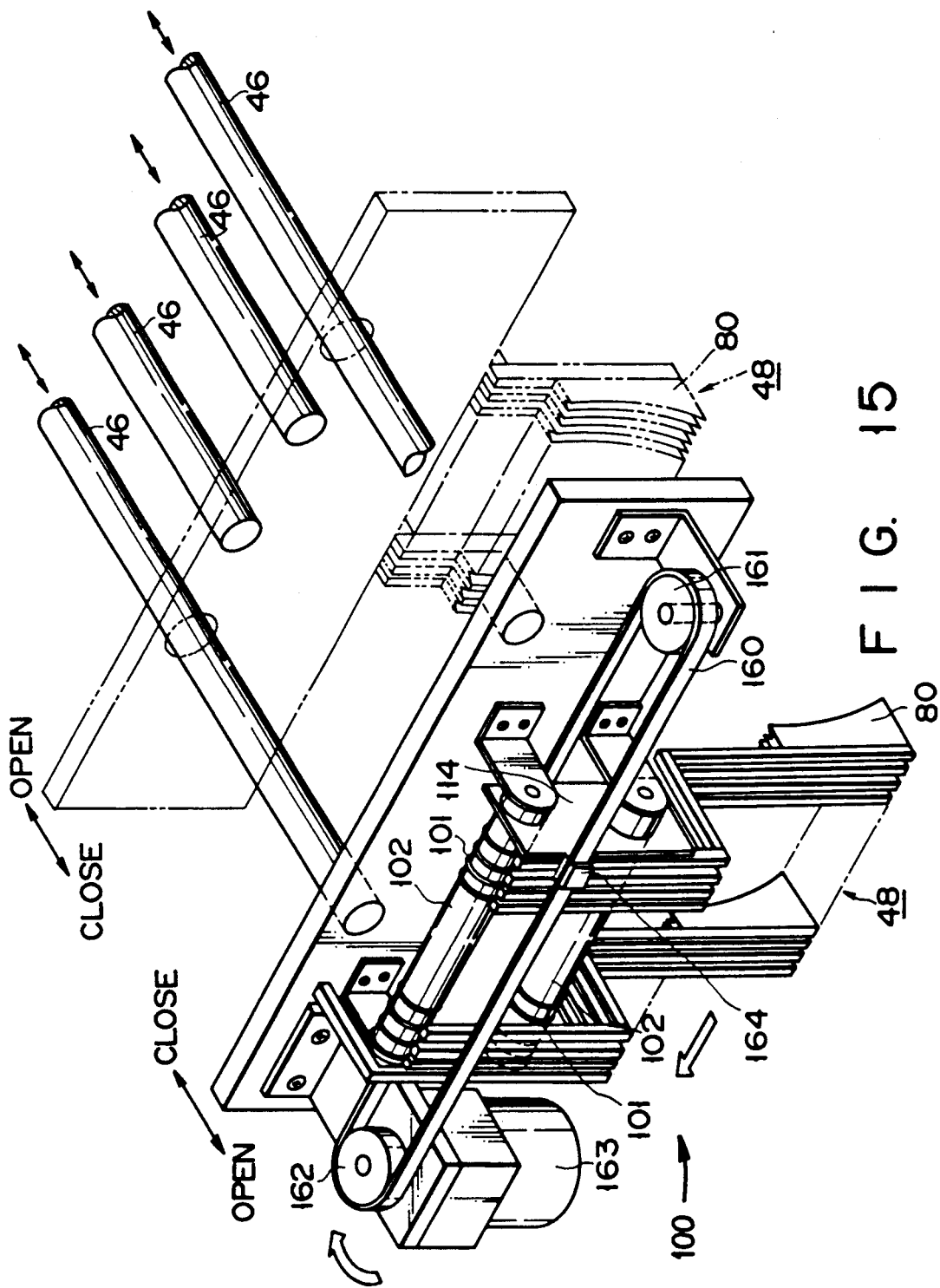
FIG. 15 is a perspective view of a mechanism for expanding/contracting and driving the elastic members by a pulley-belt combination system, showing a still another modification of the first embodiment.

As shown in FIG. 15, in place of such a driving system, the motor is directly coupled to one end of the ball screw 110 in each pitch change driving unit 100, and the two pitch change driving units 100 are synchronized with each other to rotate the motor. More specifically, two upper guide shafts 102 and two lower guide shafts 102 are disposed, and the compression coil springs 101 are respectively mounted on the guide shafts 102. In addition, the moving plate 114 is fixed to the chuck portion 80 on the moving end side. A belt 160 having its path along the arrangement direction of the chuck portions 80 is looped between an idle pulley 161 and a driving pulley 162. In addition, the driving pulley 162 is driven by a motor 163, and the moving plate 114 and one point of the belt 160 are fixed to each other by a fastener 164. Such mechanisms are respectively provided in the left and right pitch change driving units 100, and the motors 163 are rotated in synchronous with each other, so that the pitch change can be performed.

As shown in FIG. 16, the belt 160 is looped around a two-stage pulley 165 of the driving shaft of the motor 163, one motor 163 is commonly used for the left and right pitch change driving units 100, and the left and right chuck portions 80 may be interlocked with each other.

As shown in FIG. 17, the moving plate 114 is commonly used at moving end portions of the left and right pitch change driving units 100, and a rod of an air cylinder 170 may be coupled to the common moving plate 114 to interlock the left and right chuck portions 80 each other.

Assume that the plurality of coil springs 101 are used as elastic members, as described in the above embodiment. When starting positions of the coils of the springs 101 on the guide shafts 102 are different from each other, the pitches of the support pins 103 are different in the springs 101, and the wafers W cannot often be supported in parallel to each other.

In order to eliminate the above drawback, it is preferable that a stopper 113 in contact with one end of each spring 101 is rotatable about the corresponding guide shaft 102, and the springs 101 are rotated upon rotation of the stoppers 113, thus obtaining identical starting positions of the coils on the shafts.

In addition, in the above embodiment, since gear trains of the bevel gears are used as rotation output transmission systems, upon power failure, the springs 101 may be abruptly compressed to their free length by their elastic force. In order to prevent this, it is preferable that a reduction worm gear is inserted, or a emergency brake mechanism is provided on the motor 44a.

As has been described above, according to the present invention, by using a simple driving mechanism for extending/contracting the elastic members, pitches of the semiconductor wafers W can be changed together with those of the chuck portions without steps.

A second embodiment of the present invention will be described below. Note that the same description as in the first embodiment will be omitted in the second embodiment.

Figure 18:
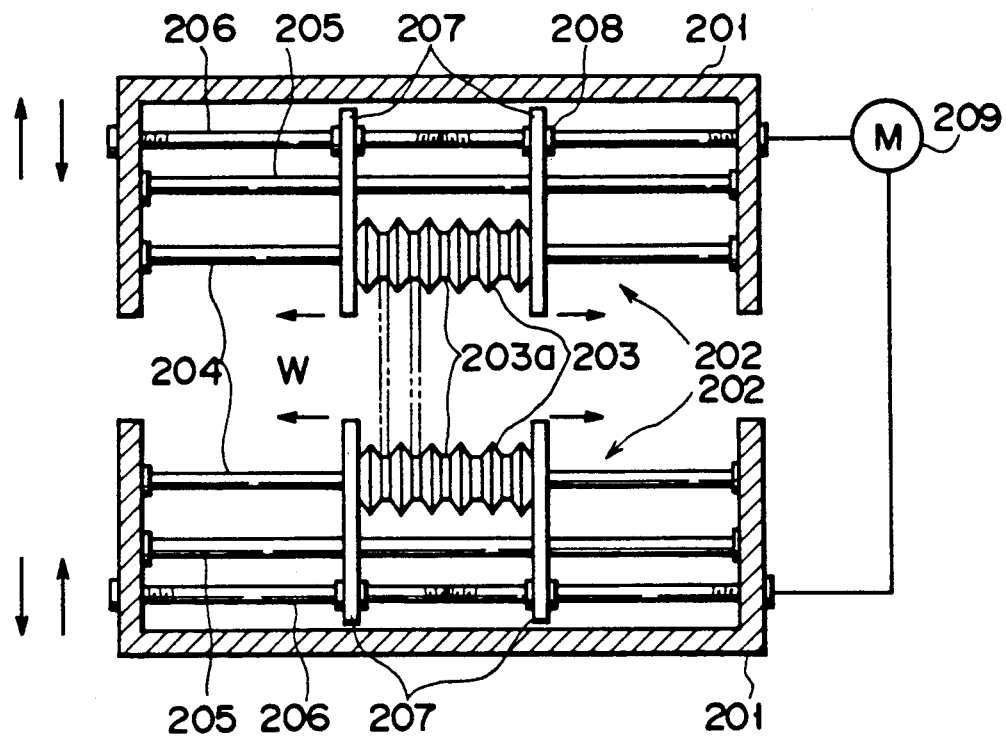
FIG. 18 is a cutaway plan view of a part of a pitch changing device according to a second embodiment of the present invention.

As shown in FIG. 18, bellows mechanisms 202 are used as elastic members in a pitch changing device according to the second embodiment.

Casings 201 each having a crescent-shaped section serving as chuck main bodies are arranged so that their inner walls each having a curved surface oppose each other. Two bellows mechanisms 202 parallel to each other are respectively mounted on the inner walls of the casings 201 along the longitudinal axis of the casings 201.

Each bellows mechanism 202 is positioned in a substantially central portion of the corresponding casing 201. Each bellows mechanism 202 has a bellows 203 of, e.g., Teflon (trade mark) or DIFLON (trade mark) having a thickness of 0.3 to 0.5 mm. Each guide shaft 204 extends through the corresponding bellows 203. Both ends of each guide shaft 204 are fixed to end portions of the corresponding casing 201, so that the bellows 203 are formed to extend/contract along the bellows guide shafts 204.

A slide shaft 205 and a driving screw 206 are sequentially mounted at each inner wall surface side of the corresponding bellows guide shaft 204 in the casing 201 and are parallel to the bellows guide shafts 204. In addition, the both end faces in the longitudinal direction of each bellows 203, each slide shaft 205, and each driving screw 206 are coupled to each other through corresponding coupling plates 207.

Abutment portions between the coupling plates 207 and the end faces of the bellows 203 are fixed. The coupling plates 207 are reciprocally movable along an axial direction. For example, the coupling plates 207 are mounted on each slide shaft 205 so that the slide shaft 205 is inserted into openings formed in the coupling plates 207. In addition, each driving screw 206 is coupled to the corresponding coupling plate 207 through a ball nut 208.

In the driving screw 206, the ridges of the right half and those of the left half are inclined in the opposite directions.

The driving screws 206 are connected to a driving motor 209. More specifically, by rotating the driving motor 209, the driving screws 206 are rotated to reciprocally move the coupling plates 207. Therefore, the bellows 203 can expand/contract.

Figure 19:
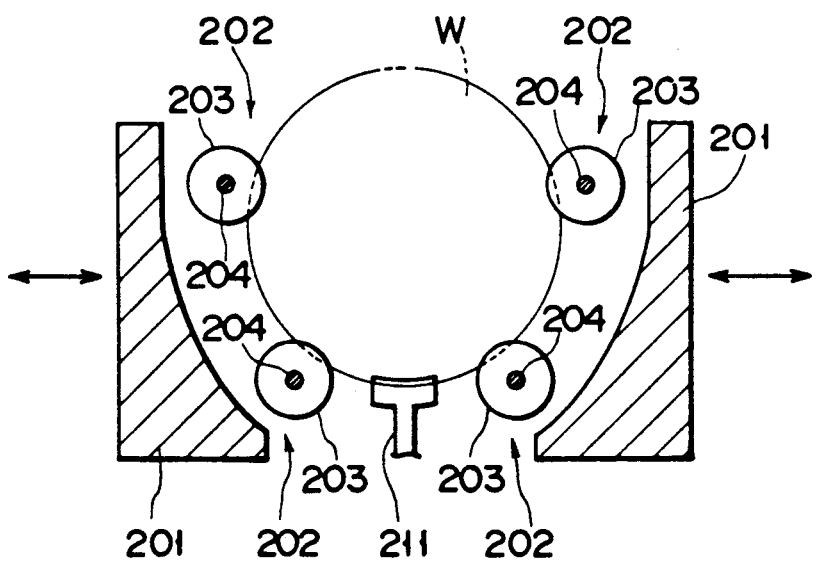
FIG. 19 is a sectional view typically showing the device of the second embodiment when viewed from its side portion.

As shown in FIG. 19, each wafer W is clamped by the two pairs of bellows mechanisms 202.

A case wherein the pitches of the semiconductor wafers are decreased by the device of the second embodiment will be described hereinafter with reference to FIGS. 20A and 20B.

A plurality of, e.g., 25, semiconductor wafers W contained are lifted off the carrier (not shown) by a wafer vertically moving table, e.g., a T-shaped wafer pick 211.

The casings 201 approach both edge side of the semiconductor wafers W by a driving mechanism (not shown). At this time, as shown in FIG. 20A, the driving motor 209 and the driving screws 206 are operated to adjust the pitches of the roots and ridges of the bellows 203 to be, e.g., 3/16 inches in advance, so that each semiconductor wafer W is inserted into corresponding root portions 203a of the bellows 203.

Thus, after each semiconductor wafer W is clamped by the root portions 203a of the corresponding bellows 203, the driving screws 206 are rotated by the driving motor 209 to decrease the interval between the coupling plates 207. Since the driving screws 206 have opposite ridges with respect to the center between the coupling plates, the coupling plates 207 approach the centers by equal distances.

As the coupling plates 207 approach, the bellows 203 contract. As shown in FIG. 20B, the pitches of the semiconductor wafers W clamped between the bellows 203 are decreaded to, e.g., ⅛ inches.

Thus, after the pitch change of the wafers W is completed, the wafers W are transferred to the wafer carrier having the same pitches as those of the above pitches using a vertically moving pick or the like, and the transfer operation is completed.

Note that when the pitches of the semiconductor wafers W are increased, the reverse operations may be performed.

A material of the bellows 203 is not limited to that in this embodiment, but various materials having heat resistance and corrosion resistance, which are relatively soft and give no damage to the semiconductor wafers W, may be used. As shown in FIG. 21, as the shape of each bellows 203, a flat portion may be formed at each root portion 203a of the bellows 203, for holding the corresponding semiconductor wafer W so as to easily hold the semiconductor wafer.

In the second embodiment, by using the bellows in the pitch changing mechanism, the expanding/contracting mechanism for the pitch change and the wafer holding mechanism can be integrated, thus largely simplifying the structure of the entire device.

As has been described above, in the pitch changing device of the semiconductor wafers according to the second embodiment of the present invention, even if the pitches of the carriers are different from each other, transfer operation can be performed for a short period of time by a simple mechanism. In addition, the operation is easily performed, and the pitch changing device for full automation is realized, thus achieving largely effective transfer operation of the semiconductor wafers.

A third embodiment of the present invention will be described hereinafter. In the third embodiment, the pitches of wafers W are changed while the wafers W are supported from their lower portion by a handler. The same description as in the first embodiment will be omitted in the third embodiment.

A handler used in the device according to the third embodiment is as follows:

1. handler for supporting lower portions of a plurality of wafers W which vertically stand at predetermined pitches in a lateral direction in a cassette, and for completely unloading the wafers W from the cassette by moving the handler upward from a lower portion of the cassette to transfer the wafers W to chucks;
2. a handler which moves toward the wafers W to support the lower ends of the wafers W supported by the chucks above the cassette, and moves downward to place the wafers W in the cassette; or
3. a handler for supporting lower surfaces of the wafers W horizontally arranged and supported at predetermined pitches in a vertical direction in the cassette, and for unloading the wafers W from the cassette by moving the handler to transfer the wafers W to a boat.

As shown in FIG. 3, the table member 62 is formed to be movable toward the portion above the stage 22 through the insertion port 24. As a vertical moving mechanism of the table member 62, a linear driving mechanism such as an air cylinder and a ball-nut can be employed. A mechanism wherein a stepwise moving piece is vertically moved by a pulley and a belt can also be employed.

Twenty-five wafer stands 380 (to be described in detail) arranged at variable pitches in accordance with pitches of supporting grooves 20a in the cassette 20 are provided to support the wafers W at their lower end portion at predetermined pitches. The handler 370 has the wafer stands 380 and moving pieces 350.

As shown in FIG. 3, therefore, by moving the table member 62 upward through the insertion port 24, the plurality of wafers W contained the cassette 20 are transferred upward while their lower ends are supported by the table member 62.

The wafers W transferred to the upper predetermined position are clamped by a chuck device 40 serving as a wafer clamping means, and transferred toward a boat 30 along a predetermined moving path.

The above-mentioned table member 62 for pushing the wafers W upward from their lower portions will be described below in detail.

Figure 22B:
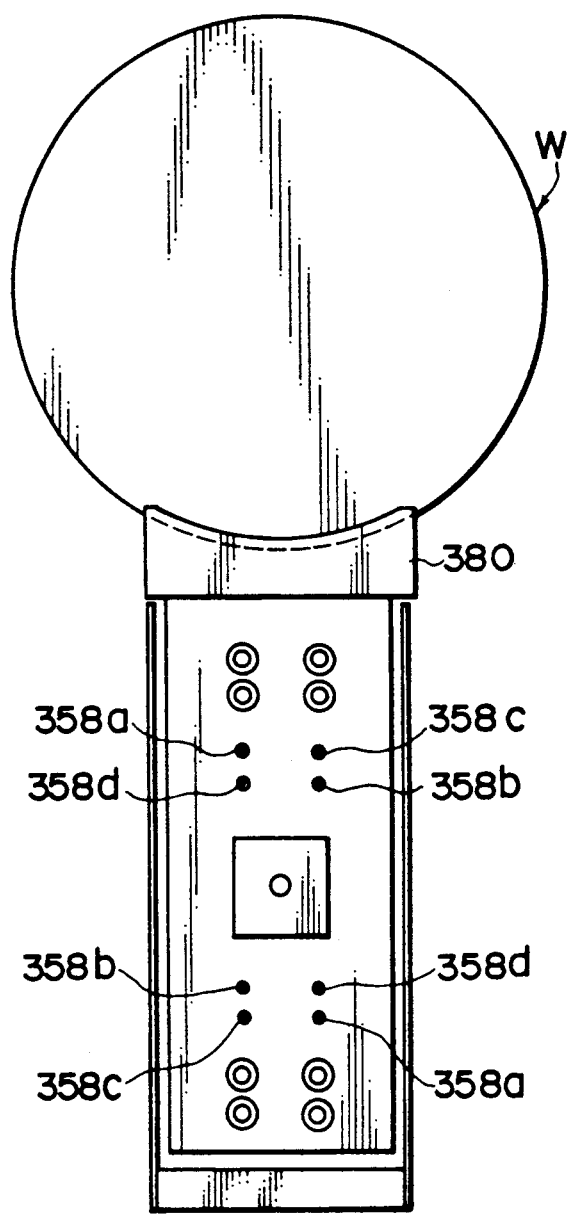
FIG. 22B is a view showing the device of the third embodiment when viewed from its side portion (indicated by an arrow A in FIG. 22A)

As shown in FIGS. 22A and 22B, four upper guide shafts and four lower guide shafts, i.e., eight guide shafts 353 extend in a casing 351 of the table member 62. The casing 351 has an open upper portion. One wafer stand 380 is fixed to on side plate 352 (a U-face side in FIG. 22A and FIG. 22C) of the casing 351. For example, 24 wafer stands 380 are positioned between a pair of side plates 352, and are respectively fixed to the moving pieces 350 which are movable along the guide shafts 353. The wafer stands 380 consist of, e.g., DIFLON (trade mark). A supporting groove 380a is formed at a distal end of each wafer stand 380 to support the corresponding wafer W. In general, a clearance between a lift mechanism 60 and the cassette 20 is small when the wafer W is transferred. In particular, since the clearance of an H-face side of the cassette 20 is small, a particularly thin frame is used for the H-face side of the wafer stand 380.

An upper side ball bearing 354 and a lower slide ball bearing 354 are mounted at each moving piece 350. Each moving piece 350 is slidable by the pair of upper guide shaft 353 and lower guide shaft 353. Note that in this embodiment, as shown in FIG. 12A, the thickness of each slide ball bearing 354 is 12 mm, i.e., is larger than the thickness of each moving piece 350 ($\frac{1}{8}$ inches in this embodiment). Therefore, when the moving pieces 350 having these slide ball bearings 354 are supported by a single guide shaft 353, as shown in FIG. 12B, the length of each slide ball bearing 354 must be a minimum pitch, and general minimum pitches of the wafers W cannot be realized.

In the third embodiment, as described above, the four upper guide shafts 353 and the four lower guide shafts 353 are used, and the guide shaft 353 different from the guide shaft 153 is used for each moving piece 350, as shown in FIG. 22C.

Figure 25:
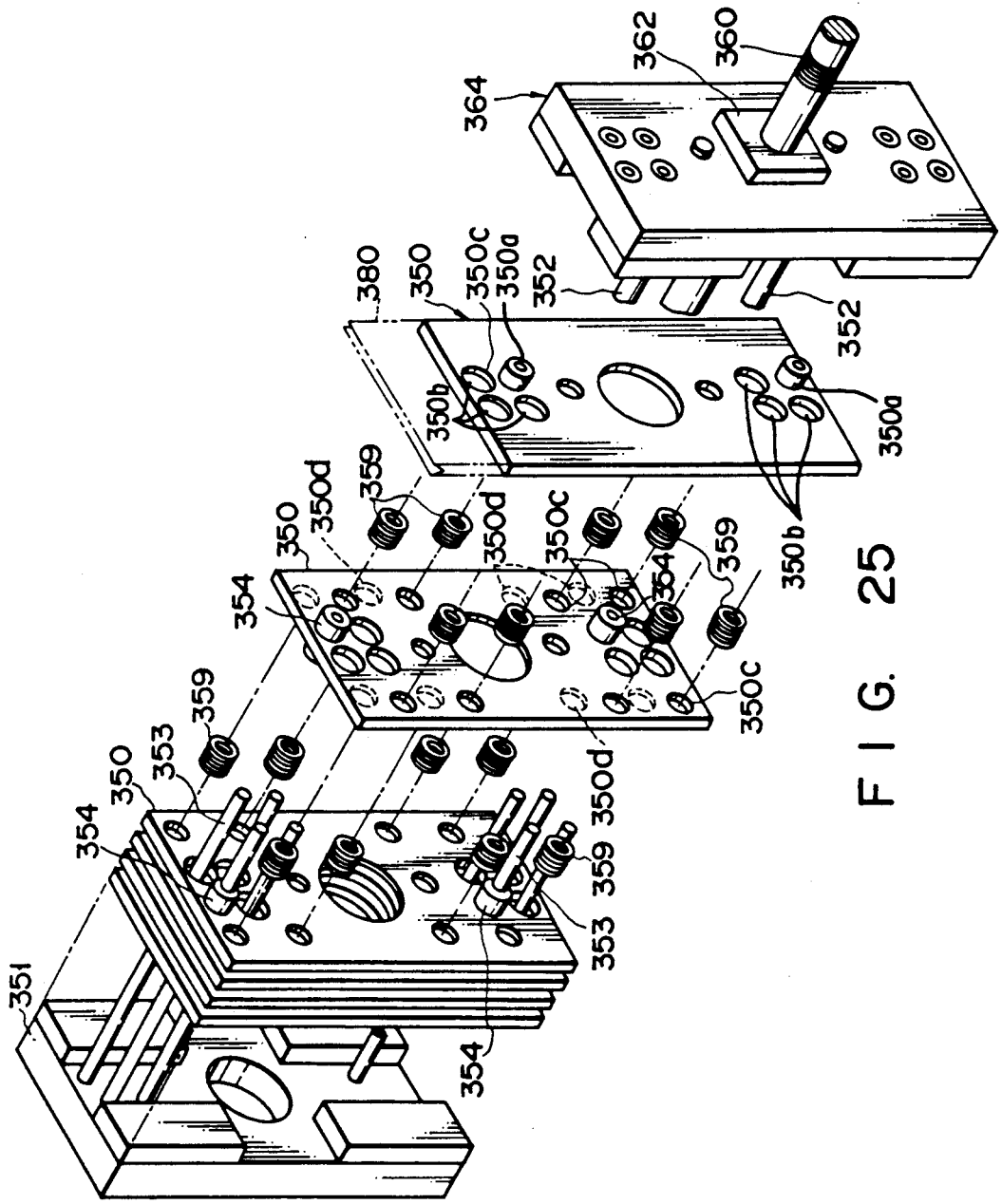
FIG. 25 is a perspective view of a mechanism wherein compression coil springs are arranged between the adjacent moving pieces, showing a modification of the third embodiment.

For this reason, as is apparent from FIG. 22C and FIG. 25, the slide ball bearings 354 need to not interfere with each other between the adjacent moving pieces 350. Therefore, an upper hole 350a and a lower hole 350a for fixing the slide ball bearings 354, and three upper holes 350b and three lower holes 350b for preventing the bearing interference are formed in each moving piece 350.

A driving mechanism for changing the pitches of the moving pieces 350 and those of the wafer stands 380 to, e.g., $\frac{1}{8}$ inches and 3/16 inches, respectively will be described hereinafter.

An air cylinder 355 is fixed to the side plate 352 in the U-face side. As shown in FIG. 22A, a driving piece 356 which is reciprocally movable is fixed to the moving piece 350 nearest to the H-face side by the air cylinder 355. The moving pieces 350 are fixed to each other by driving the air cylinder 355 (a state in FIG. 22A), so that the above-mentioned $\frac{1}{8}$-inch pitch can be realized.

As shown in FIG. 22C, a 3/16-inch pitch between the adjacent moving pieces 350 can be realized by stoppers 357. Each stopper 357 consists of a screw having a seat 357a fixed to each of upper and lower portions of each moving piece 350 by, e.g., set screws. The movement of a given moving piece 350, adjacent to the moving piece 350 to which the stoppers 357 are fixed, is restricted by the seats 357a of the stoppers 357, and the pitches between the adjacent moving pieces 350 are 3/16 inches at this position.

When one stopper 357 is arranged, a space for four moving pieces 350 is required in the axial direction because of the clearance of the stopper. For this reason, as shown in FIG. 22C, the stopper 357 is fixed to a position 358a in the first, fifth, ninth, . . . moving pieces, the stopper 357 is fixed to a position 358b in the second, sixth, 10th, . . . moving pieces, the stopper 357 is fixed to a position 358c in the third, seventh, eleventh, . . . moving pieces, and the stopper 357 is fixed to a position 358d in the fourth, eighth, twelfth, . . . moving pieces 350. Therefore, the stoppers 357 are not interfered with each other. Note that, in order to keep a clean environment around the semiconductor wafers W, e.g., a vacuum suction is performed in the inner space of the casing 351 wherein the moving pieces 350 are thus moved, to prevent external scattering of dust or the like.

An operation will be described below with reference to FIGS. 23A to 23E.

In this embodiment, first, the cassettes 20 which receive the wafers W are arranged at pitches of 3/16 inches. When the wafers W are transferred while the pitches are kept unchanged, a pitch change is not required. However, the pitches of the wafers W are often changed depending on different processes, or the like. For example, when the number of wafers for one process is increased to improve "a throughput", $\frac{1}{8}$-inch pitch is often employed.

Thus, when the wafers W are loaded on the boat 30 at pitches (e.g., $\frac{1}{8}$ inches) different from the pitches (e.g., 3/16 inches) in the cassette, the pitch change is performed in accordance with the following steps.

First, when the wafers W in the cassette 20 are simultaneously pushed upward by the lift mechanism 60, the pitches of the cassettes 20 must be equal to those of the wafer stands 380 of the lift mechanism 60.

As shown in FIG. 22C, the moving piece 350 nearest to the H-face side is moved to the right in FIG. 22C by driving the air cylinder 355. In addition, this moving piece 350 is moved to a position wherein the distance between the adjacent moving pieces 350 is limited by the stoppers 357, so that the moving pieces 350, i.e., the wafer stands 380 are arranged at pitches of 3/16 inches.

Figure 23A:
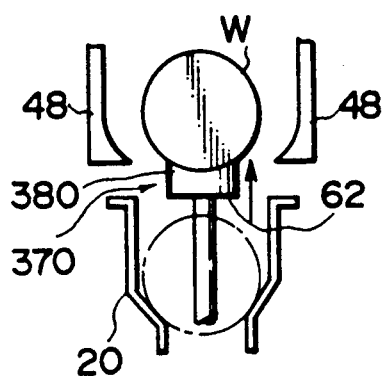
FIGS. 23A to 23E are views of chuck portions, cassettes, wafers, and the like when viewed from their side portions, for explaining a case wherein the wafers are transferred from the cassette to the boat.

After this state is set, the table member 62 is moved upward, and the wafers W in the cassette 20 are respectively supported by the wafer stands 380 mounted on upper ends of the moving pieces 350. The table member is further moved upward, and the wafers W in the cassette 20 can be unloaded toward a portion above the cassette 20. As shown in FIG. 23A, when the table member 62 is moved upward to the position wherein each wafer W is placed between a pair of chucks 48, the table member 62 stops.

Before the wafers W are unloaded from the cassette 20 and are clamped between the pairs of chucks 48, the pitch change between the wafer stands 380 is executed.

More specifically, the moving piece 350 nearest to the H-face side is moved to the left in FIG. 22C by driving the air cylinder 355, until the moving pieces 350 are brought into tight contact with each other. As a result, as shown in FIG. 22A, the wafer stands 380 are arranged at pitches of $\frac{1}{8}$ inches.

When such a pitch change is performed, each wafer stand 380 supports only the lower portion of the corresponding wafer W. Therefore, even if the pitches between the adjacent wafer stands 380 are different from each other in the pitch changing process, support of the wafers W is not interfered. More specifically, as compared with the first embodiment wherein the above pitch change is performed by the pair of chucks 48, both edge ends of each wafer W are clamped between the pair of chucks 48. Therefore, unless both the chucks 48 are moved in synchronous with each other, a load to deform the wafers W often acts thereon. However, when the pitch change is executed using the lift mechanism 60, the pitch change can be easily performed without such a requirement upon movement of the wafers W for the pitch change.

Figure 23B:
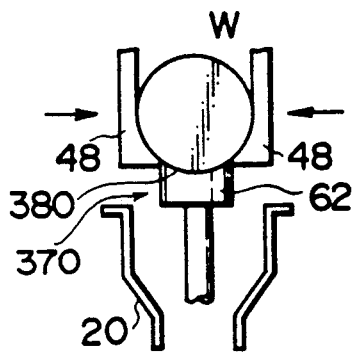

As shown in FIG. 23B, the wafers W thus arranged at pitches of $\frac{1}{8}$ inches are respectively clamped between the pairs of chucks 48, by driving a head 44 to decrease the distance between each pair of chucks 48.

Figure 23C:
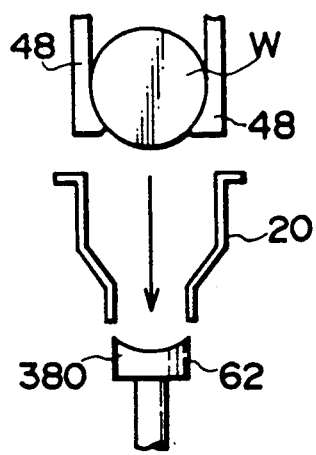

As shown in FIG. 23C, the table member 62 of the lift mechanism 60 is moved downward to the initial position, so that each wafer W is supported by only the pair of chucks 48.

Figure 23D:
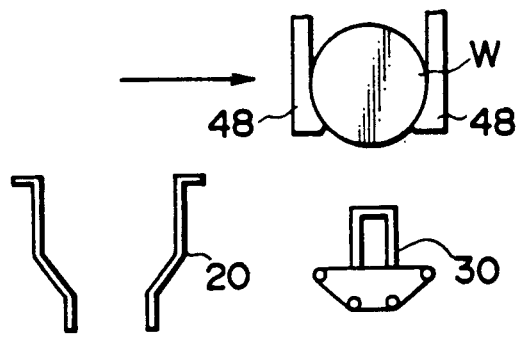
Figure 23E:
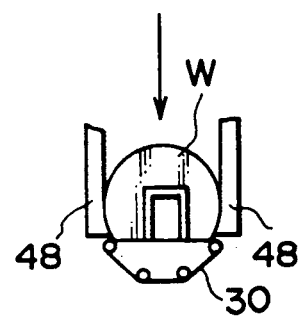

In addition, as shown in FIG. 23D, the pair of chucks 48 are moved toward a portion above the boat 30, then are moved downward, and the distance of each pair of chucks is increased. Therefore, as shown in FIG. 23E, the wafers W (the grooves for supporting the wafers are arranged at pitches of $\frac{1}{8}$ inches) can be transferred from the pairs of chucks 48 to the boat 30.

Note that, thereafter, the boat 30 is loaded in an annealing path, and is unloaded after the wafers W placed on the boat 30 are annealed. However, when the pitches of the wafer W after annealing are changed, and the resultant wafers are returned from the boat 30 to the cassette 20, steps may be performed in a reversed order.

In the above embodiment, the pitches of the wafer supporting grooves of the boat 30 must be equal to those of the pair of chucks 48. In this case, a plurality of pairs of chucks 48 arranged at different pitches may be prepared. However, the pitch change driving unit 100 is provided, and the pitches of the pairs of chucks may be variable.

A case wherein the boat 30 for a vertical type furnace is used will be described below with reference to FIG. 24. When a boat 330 is horizontally placed, two upper supporting rods (in which grooves for supporting wafers are respectively formed) 330a are disposed on the positions higher than the center of each wafer W. For this reason, even if the vertical boat 330 is used, the wafers W can be stably supported. When the wafers W are transferred to the boat 330 for the vertical type furnace, only operations different from those shown in FIGS. 23A to 23E will be described below.

Figure 24:
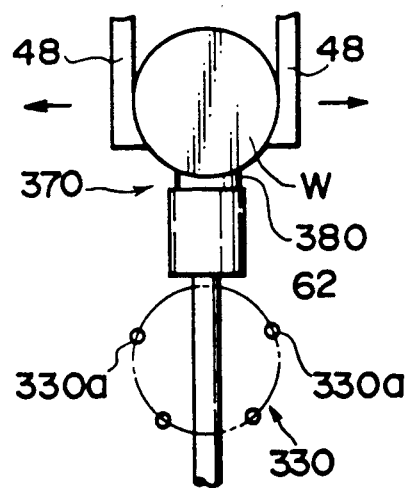
FIG. 24 is a view showing the chuck portions, the boat, the wafers, and the like when viewed from an upper side, for explaining a case wherein the wafers are transferred in a vertical furnace.

The table member 62 of the lift mechanism 60 is moved upward to support the wafers W, and the wafers W are supported by the wafer stands 380, as shown in FIG. 24. Thereafter, the table member 62 is moved downward to transfer the wafers W to the boat 330, because when the pair of chucks 48 are moved downward, the chucks are interfered with the supporting rods 330a of the boat 330.

When the wafers W are transferred to the boat 330 for the vertical type furnace, therefore, the pitch change can be performed immediately before the wafers W are transferred to the boat 330. If the pitch change can be executed immediately before the wafers W are transferred to the boat 330, the pitches of the grooves in the pair of chucks are not required to be equal to those of the boat 330, but they may be equal to those of the cassette 20.

As shown in still another modification in FIG. 25, even if a plurality of springs 359 are arranged between the adjacent moving pieces 350, the pitch change can be similarly performed.

The eight compression springs 359 are arranged between the adjacent moving pieces 350 so as to always keep distances unchanged between the adjacent moving pieces 350. For this reason, four upper spot-faced holes 350c and four lower spot-faced holes 350c, for supporting the springs 359 are formed in one surface of each moving piece 350. The same number of spot-faced holes 350d are formed in the other surface of each moving piece 350 at different positions from those on one surface.

The compression springs 359 supported by the spot-faced holes 350c and 350d are the same as those in the first embodiment (see FIG. 14).

As a driving source of the moving pieces 350, a ball screw 360 is used in this case. A nut 362 threadably engaged with the ball screw 360 is mounted at the moving plate 364 nearest to the H-shaped surface side shown in FIG. 22A.

With the above arrangement, when the moving plate 364 is moved to, e.g., the left in FIG. 25 by rotating and driving the ball screw 360, the coil springs 359 between the adjacent moving pieces 350 receive the equal forces to be compressed by the same magnitude. Therefore, variable change of the pitch width can be performed while the moving pieces 350 are kept at equal pitches. In this case, the pitches between the adjacent moving pieces 350 can be changed without steps.

Note that the present invention is not limited to the above embodiments, and various changes and modifications may be made without departing from the spirit and scope of the invention.

Figure 26:
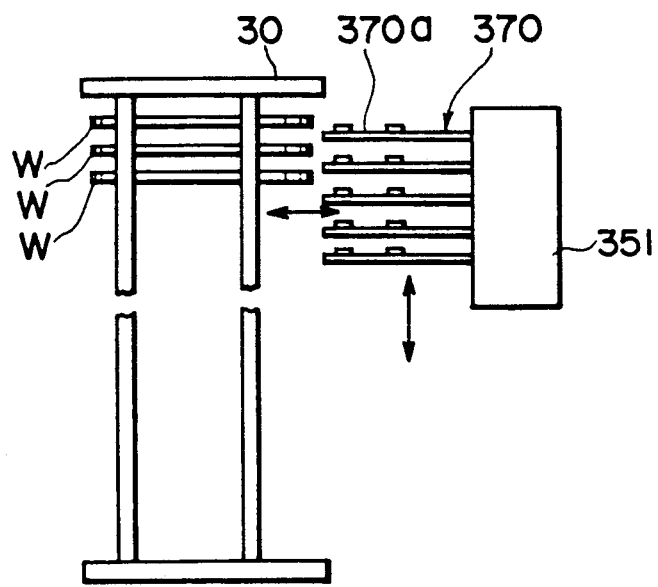
FIG. 26 is a plan view for explaining a case wherein the wafers are transferred by handlers while the boat for the vertical furnace stands.

For example, when the wafers W are transferred while the boat 330 for the vertical type furnace is vertically set, the following arrangements can also be employed. As shown in FIG. 26, handlers 370 each having a suction surface 370a on one surface are horizontally inserted between the adjacent wafers W in the boat 30. The wafers W are chucked and withdrawn, and the pitch change between the adjacent handlers 370 is performed by the above-mentioned mechanisms in this state. Thereafter, the handlers are rotated 90°, and the wafers W are transferred to the cassette 20 while a vertical state of the wafers W is kept. Note that the pitch change may be performed after the handlers are rotated through 90°. When the wafers W are transferred from the cassette 20 to the boat 30, steps may be performed in a reversed order.

The application of the present invention is not limited to the device for manufacturing the semiconductor wafers. The present invention can also be applied to pitch change of various plate-like objects.

What is claimed is:

1. A pitch changing device for changing pitches of semiconductor wafers arranged in parallel to each other, comprising:
    means for unloading a plurality of wafers arranged in containing means at predetermined pitches while the pitches are kept unchanged; and
    holding means for holding the unloaded wafers while the pitches are depth unchanged,
    said holding means including,
    a plurality of movable members for respectively holding the unloaded wafers,
    elastic means, including a plurality of springs, for varying the pitches between the wafers which are held by the movable members, and
    driving means, including a drive shaft surrounded by the springs, flow allowing expansion/contraction of said springs, wherein pitches of the wafers are changed when said springs are expanded/contracted by the driving means while the wafers are respectively held by the movable members.

2. The device according to claim 1, wherein said springs are compression coil springs.

3. The device according to claim 2, wherein said compression coil springs are mounted between adjacent ones of said movable members.

4. The device according to claim 2, wherein movable portions of said compression coil springs are shorter than a maximum pitch of the wafers.

5. The device according to claim 1, wherein eight springs are provided between each pair of the movable members, said eight springs being arranged symmetrical around said drive shaft both in a horizontal direction and in a vertical direction.

6. The device according to claim 1, wherein two of said springs are lactated above said drive shaft, and one of the remaining springs is located below said drive shaft, such that the center o gravity of said drive shaft is positioned in an intersecting point of two lines, one of said two lines connecting an axis of one of said two springs located above to a bisection point of a line which connects an axis of the other of said two springs to an axis of said one spring located below, and the other of said two lines connecting the axis of the other of said two springs to a bisection point of a line which connects the axis of said one of said two springs to said axis of said one spring.

* * * * *